(12) United States Patent
Otsuka et al.

(10) Patent No.: US 6,373,275 B1
(45) Date of Patent: Apr. 16, 2002

(54) ELECTRONIC DEVICE CAPABLE OF GREATLY IMPROVING SIGNAL TRANSMISSION SPEED IN A BUS WIRING SYSTEM

(75) Inventors: Kanji Otsuka, 1074-38, Kohan 2-chome, Higashiyamato-shi, Tokyo; Tamotsu Usami, 38-4, Nishimachi 2-chome, Kokubunji-shi, Tokyo, both of (JP)

(73) Assignees: Kanji Otsuka; Tamotsu Usami, Tokyo; Kabushiki Kaisha Toshiba, Kawasaki; Oki Electric Industry Co., Ltd., Tokyo; Sanyo Electric Co., Ltd., Moriguchi; Sharp Kabushiki Kaisha, Osaka; Sony Corporation; NEC Corporation, both of Tokyo; Fujitsu Limited, Kawasaki; Matsushita Electronics Corporation, Takatsuka; Mitsubishi Denki Kabushiki Kaisha; Hitachi, Ltd., both of Tokyo; Rohm Co., Ltd., Kyoto, all of (JP)

( * ) Notice: Subject to any disclaimer, the term of this patent is extended or adjusted under 35 U.S.C. 154(b) by 0 days.

(21) Appl. No.: 09/456,303

(22) Filed: Dec. 8, 1999

(30) Foreign Application Priority Data

Dec. 8, 1998 (JP) .......................................... 10-348270

(51) Int. Cl.[7] .................. H03K 19/003; H03K 19/0175
(52) U.S. Cl. .......................................... 326/30; 326/86
(58) Field of Search ............................. 326/30, 82, 83, 326/86, 112

(56) References Cited

U.S. PATENT DOCUMENTS

| | | | |
|---|---|---|---|
| 4,481,625 A | * 11/1984 | Roberts et al. | 370/464 |
| 5,214,318 A | * 5/1993 | Nakanishi et al. | 326/124 |
| 5,717,345 A | * 2/1998 | Yokomizo et al. | 326/80 |
| 5,767,699 A | * 6/1998 | Bosnyak et al. | 326/86 |
| 5,977,796 A | * 11/1999 | Gabara | 326/86 |

FOREIGN PATENT DOCUMENTS

JP  03171849 A  * 7/1991  ................. 375/257

* cited by examiner

Primary Examiner—Michael Tokar
Assistant Examiner—James H. Cho
(74) Attorney, Agent, or Firm—Antonelli, Terry, Stout & Kraus, LLP

(57) ABSTRACT

An electronic device which improves speed of signal transmission in a bus wiring system by specifying circuit configuration of a driver circuit and transmission line characteristic impedance. An input/output circuit combines a differential driver of current switch type with a bus wiring system having a transmission line for transmitting a differential complementary digital signal and a termination end resistor matching the transmission line. An integrated circuit chip including the differential driver is mounted on a wiring board including the transmission line and the termination end resistor. The transmission line includes wires having an equal length which have characteristic impedance of 25Ω or less. In combination with the current switch type differential driver, this transmission line structure restricts attenuation of signal energy during transmission and restricts electromagnetic interference between transmission lines close to each other.

26 Claims, 17 Drawing Sheets

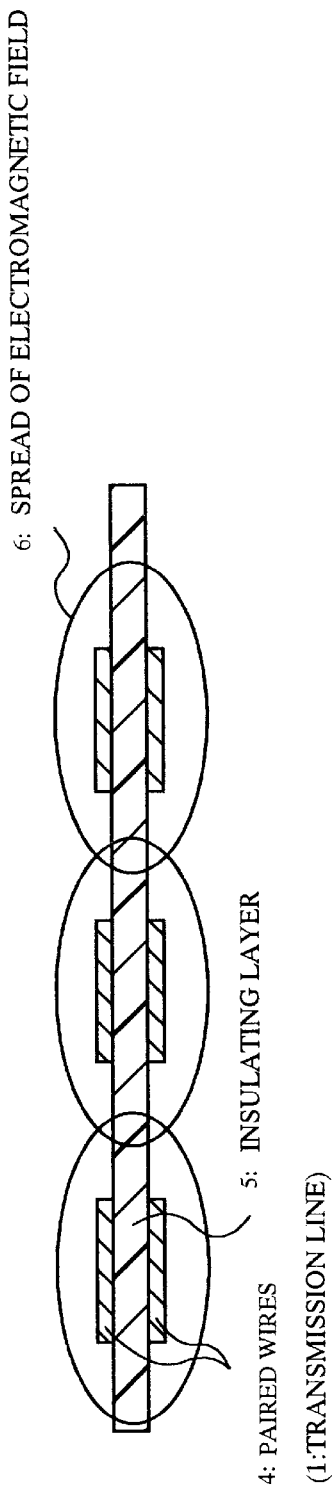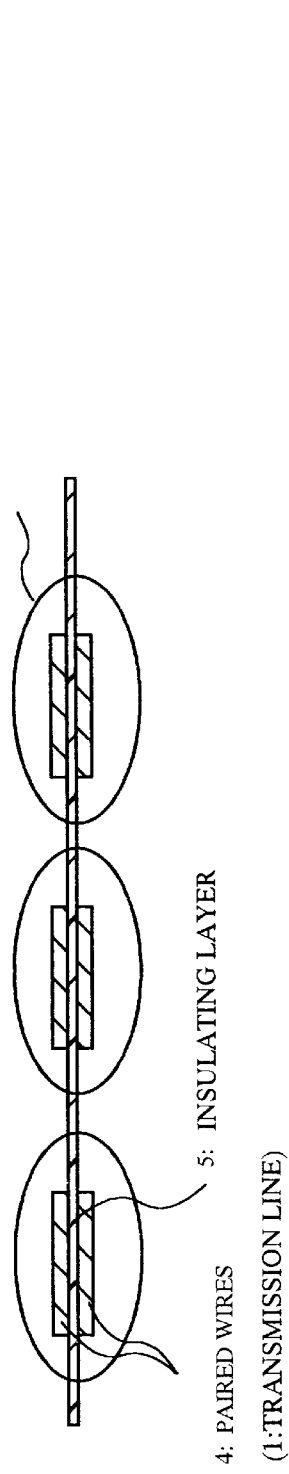

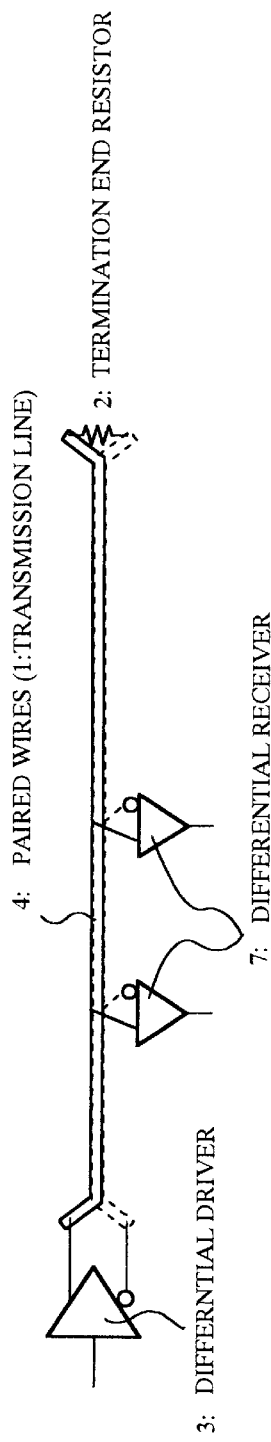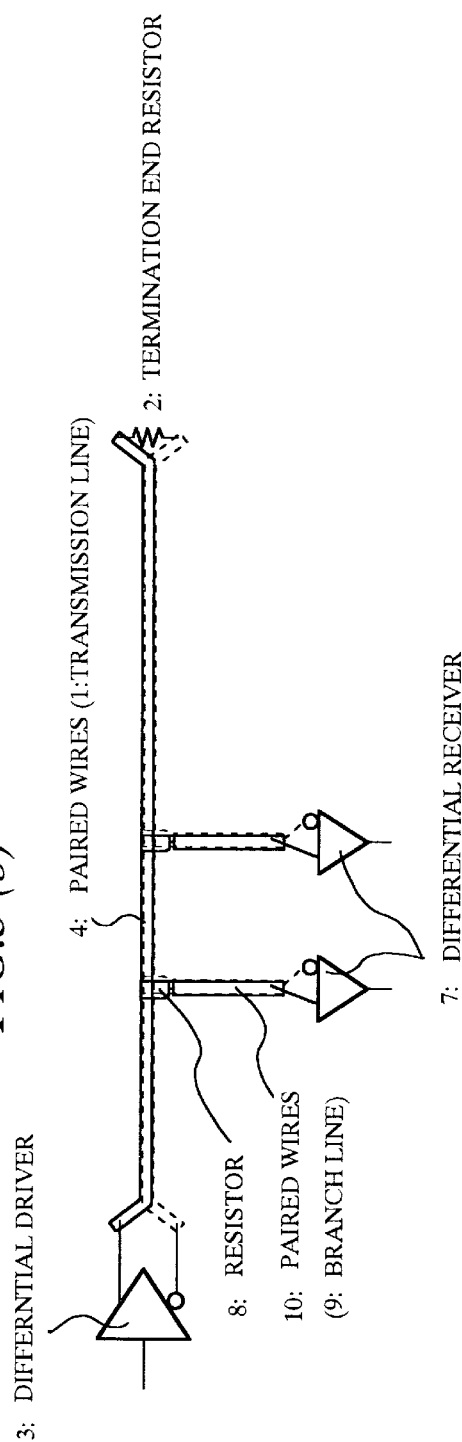

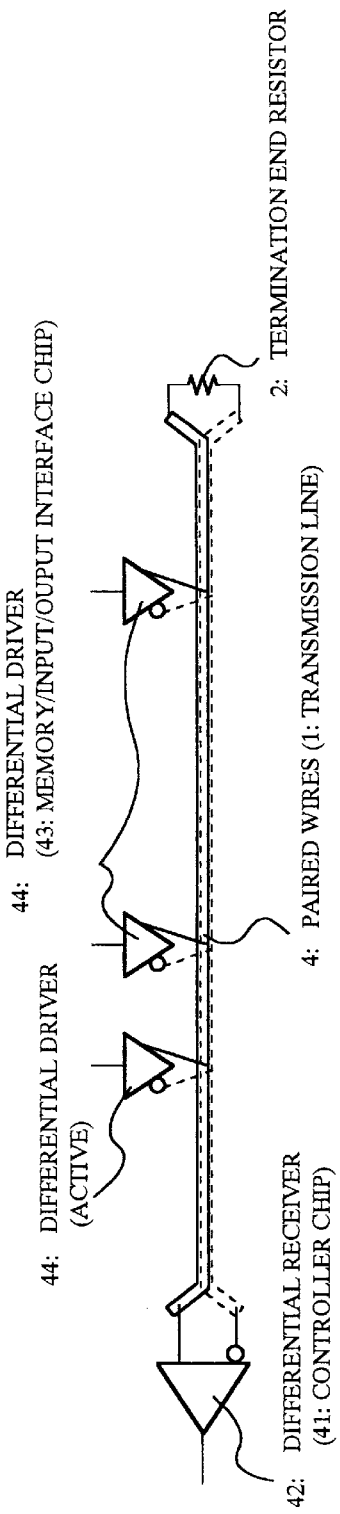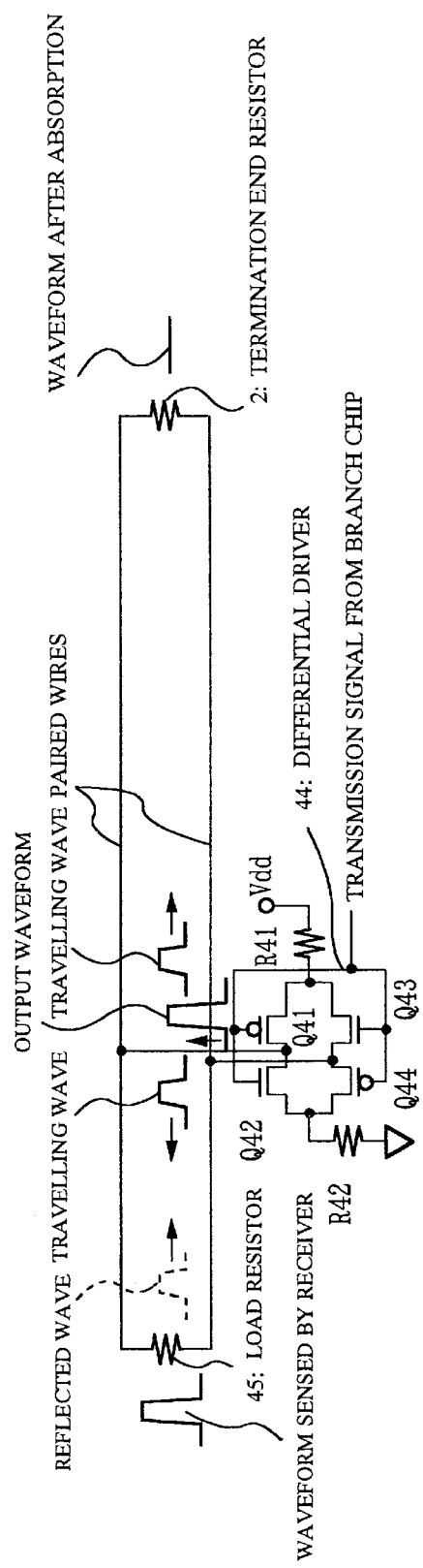
FIG.9 (a)
FIG.9 (b)

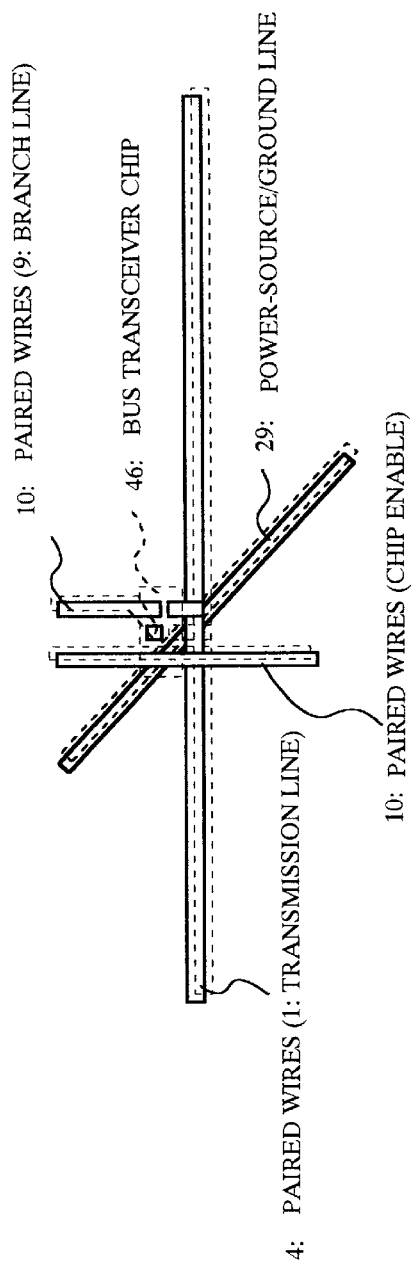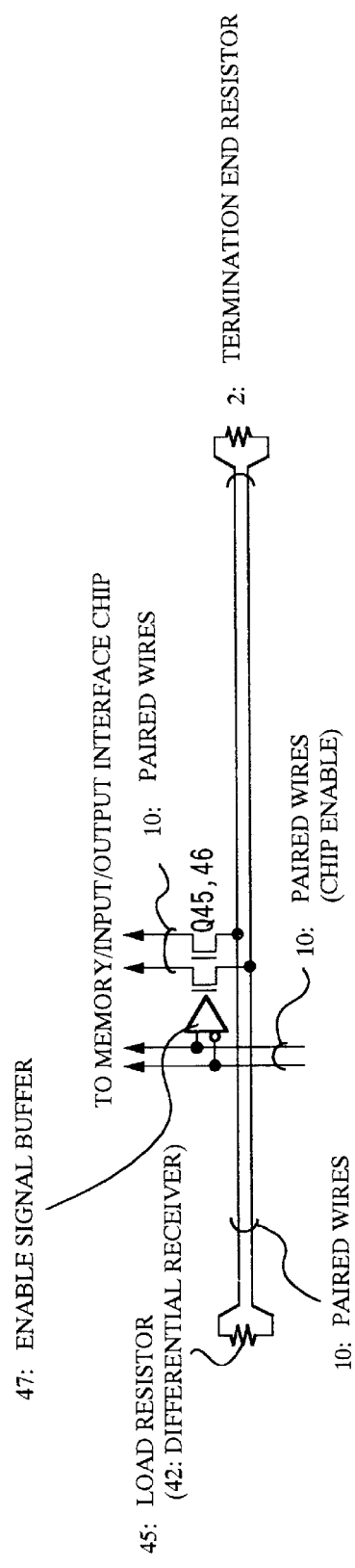
FIG.10 (a)
FIG.10 (b)

ELECTRONIC DEVICE CAPABLE OF GREATLY IMPROVING SIGNAL TRANSMISSION SPEED IN A BUS WIRING SYSTEM

TECHNICAL FIELD OF THE INVENTION

The present invention relates to a transmission technique for an electronic device, and, particularly to a technique which is effectively applied to a chip input/output circuit system, which combines a driver circuit with a bus wiring system comprising a transmission line and a termination circuit matched with the line.

BACKGROUND OF THE INVENTION

For example, a circuit structure as shown in FIG. 17, which shows a main part of an input/output circuit forming part of an electronic device, is considered to be a conventional technique which the present inventor has discussed in relation to a chip input/output circuit system. This input/output circuit comprises a differential driver 101 which converts an inputted digital signal into a complementary signal and transmits the signal; a differential receiver 102 which receives the complementary digital signal and outputs a digital signal corresponding to the inputted digital signal; and paired signal wires 103 which connect the differential driver 101 with the differential receiver 102. This circuit is arranged in order to transmit the complementary digital signal outputted from the differential driver 101 to the differential receiver 102.

In the input/output circuit of this electronic device, the differential driver 101 and the differential receiver 102 respectively comprise drivers 104 and 106, and inverters 105 and 107, each of which has a CMOS circuit structure comprising a pMOS transistor and an nMOS transistor. This structure operates complementarily, so that one of the transistors is turned on and the other is turned off when an inputted digital signal shifts from a low level to a high level, or from a high level to a low level. When an inputted digital signal thus shifts, by supplying complementary signal energy to the paired signal wires 103 from the differential driver 101a a complementary digital signal is transmitted to the differential receiver 102 through the paired signal wires 103.

SUMMARY OF THE INVENTION

Meanwhile, the following has been revealed as a result of studies by the present inventors with respect to an electronic device as described above. For example, if the paired signal wires in the electronic device described above are parallel wires having an equal length, which has a coupling coefficient close to 1, the paired signal wires can be structured as a transmission line whose electromagnetic field is substantially closed, and the complementary digital signal is transmitted in a mode (sub-TEM) close to TEM (Transversed Electromagnetic Mode) transmission so that the signal can be handled at high speed. This transmission line is one examples of a measure for transmitting a signal with high speed.

For example, suppose that a bus for exchanging signals in an electronic device is a transmission line. When a driver which supplies a signal sends a high-energy signal (which is a signal in a high state) to the bus, energy is required to raise the entire bus wire set at a ground level (which is a state of a low level) to a high level. This operation must be done before the driver transmits the signal to a receiver, if the signal rises at high speed.

Therefore, in the case where the rising time of a signal comes after the time required for supplying energy to the entire bus wire (which is the transmission delay time of the bus wires), energy supply from the driver is performed substantially in parallel to both the bus and the receiver, and there is almost no possibility that the receiver side can become aware of the existence of the bus. That is, this kind of serial work is a phenomenon which must be taken into consideration when the signal rising time is faster than the delay time of the bus wire. Naturally, it is the same with the opposite case of a transition to a low level, and such an operation to release the energy of the bus wire in a high-energy state is first required.

This kind of driver design need only enough energy to charge the load to the receiver when the rising of a signal is slower than the delay time of a bus. However, since an ordinary standard system now uses a high-speed signal, which has a shorter signal rising time than the delay time of a bus transmission line, it is more important to design how the energy should be supplied to the bus than to consider the characteristics of the receiver.

For example, an excellent receiver can sufficiently sense very weak signal energy and can change the state of the receiver itself, but does not consume the electric energy of signals. That is, an excellent receiver has a high direct-current resistance, for example, 1 K$\Omega$. In contrast, a bus transmission line has a characteristic impedance of 25 to 200$\Omega$ and consumes energy which is greater by 1 or 2 digits than the receiver of the bus.

In this respect, the transmission time is 1.5 ns in the case where the length of a bus wire is set to 30 cm and the signal transmission speed is set to $2\times10^8$ m/s. Regardless of the position of the branch of the receiver, the period in which the signal flows through the entire length of the transmission line, for example, the period of 1.5 ns is a time for supplying the bus with energy. The driver must keep supplying energy during this period. Thus, the driver must have the ability to take the characteristic impedance as a load.

For example, in FIG. 18, which shows an equivalent circuit after a transition start of a signal immediately before the end of transmission of the signal to the termination end of a bus, if a differential driver 112 is connected to the start end of a transmission line 111, the bus must keep flowing a current during the period of 1.5 ns in the equivalent circuit shown in FIG. 18. In this respect, where the differential driver 112 has an internal resistance of 50$\Omega$, a load resistance of 50$\Omega$, and a Vdd voltage of 0.5 V, the resistance must be 50$\Omega$ at 5 mA. From this value, the differential driver can be regarded as having a large drive ability. In this equivalent circuit, it is considered that the signal recognizes a termination end resistance from the instance when signal energy reaches a termination end, and the energy charge to the transmission line 111 is finished. Therefore, the load resistance 113 which is equivalent to the characteristic impedance of the transmission line 111, disappears, and the equivalent circuit then becomes as shown in FIG. 19.

In FIG. 19, suppose that the termination end resistor 114 now has a resistance of 50$\Omega$, matched with the characteristic impedance of the bus, depending on the transmission line 111. Then, all of the energy is absorbed by this termination end resistor 114 and is discharged as a heat. As a result, no reflected energy returns. Even if a disturbance is caused due to a small parasitic element such as a branch or the like, no multiple reflection is prevented by the absorption described above. However, since the termination end resistor 114 is equal to the characteristic impedance of the bus, the differential driver 112 must keep current flowing of 5 mA as long as the high state continues. Therefore, the differential driver 112 which drives the transmission line 111, should desirably be a current switch circuit.

In addition, since the energy absorption by the termination end resistor 114 increases the electric power consumption of the bus wiring system, as a result, the energy absorption amount must be reduced. That is, in order to reduce the drive ability of the differential driver 112, a direct current resistance must be inserted so that the voltage is reduced. For example, if the voltage sensitivity of a differential receiver is increased, 50 mV or so can be achieved at the most. A current circuit or a differential circuit can be said to be a preferable driver. In principal, the signal amplitude can be reduced to as small as possible. This kind of bus structure is an ideal structure for a high-speed transmission line.

The present invention hence takes into consideration a bus structure as a transmission line, and has an object of providing an electronic device capable of high-speed signal transmission in a bus wiring system by specifying a circuit configuration of a driver circuit, and a characteristic impedance of a transmission line in an input/output circuit, which combines a driver circuit with a bus wiring system comprising transmission line and a termination end circuit matched with the transmission line.

The above-mentioned and other objects, in addition to a novel feature of the present invention, will be clearly understood from the description of the present specification and the drawings attached hitherto.

Representative aspects of the invention disclosed in the present application will be summarized in brief in the following discussion.

That is, An electronic device comprising: a transmission line; a termination circuit matched with said transmission line; a driver circuit for supplying a bus wiring system with a complementary signal, said driver circuit comprising said transmission line and said termination end circuit; a wiring board including said transmission line and said termination end circuit; and a first integrated circuit chip including said driver circuit and mounted on said wiring board. The transmission line is of a bus structure in which a line having characteristic impedance of 25Ω or less, and having a structure comprising opposed paired wires, is wired such that said opposed paired wires are parallel to each other and have an equal length. As a result of this, it is possible to perform signal transmission at a high speed in a bus wiring system comprising a transmission line and a termination end circuit.

In this structure, the driver circuit is of a current switch type, and further, a pure resistor is connected in series with the driver circuit, thereby to form a ON-resistance which is equal to or higher than the characteristic impedance of the transmission line, or is preferably three times or more higher than the characteristic impedance of the transmission line.

In addition, in an electronic device according to the present invention, which relates to a one-way signal transmission structure from a first integrated circuit chip to a second integrated circuit chip, a second integrated circuit chip is connected to have a receiver circuit branched from and connected to the bus of the transmission line, and the receiver circuit has a high impedance of 1 KΩ or more. Further, when the receiver circuit is connected with a branch line having a transmission line structure of 4 mm or less, a pure resistor of 0.4 to 1 KΩ is connected in series with both of the opposed paired wires, at a branch portion of the branch line. Also, an insulating layer between the transmission line and the branch line has a thickness which is several times as large as the thickness of an insulating layer between the opposed paired wires of both the transmission line and the branch line. As a result of this, it is possible to perform, a one-way signal transmission at a high speed in from the first integrated circuit chip to the second integrated circuit chip.

Further, a power-source/ground line fanned out from the first integrated circuit including the driver circuit, is structured in a transmission line structure, and the transmission line of the power-source/ground line, comprising paired power-source wire and ground wire, has a characteristic impedance equal to or lower than the characteristic impedance of a signal line.

On the contrary, in an electronic device according to the present invention, which relates to one-way signal transmission from a second integrated circuit chip to a first integrated circuit chip, a second integrated circuit chip having a driver circuit of a current switch type is branched from and connected to a bus of the transmission line. The first integrated circuit chip has a receiver circuit of high impedance, and a complementary signal sent from the driver circuit of the second integrated circuit chip is received by the receiver circuit of the first integrated circuit chip. As a result of this, it is possible to perform a one-way signal transmission at a high speed from the second integrated circuit chip to the first integrated circuit chip.

In this structure, the signal flowing from the driver circuit to the transmission line flows with a ½ amplitude, each in directions toward the receiver circuit and the termination end circuit, and signal energy is totally reflected at the receiver circuit, thereby recovering an original amplitude, so that the receiver circuit operates normally, while signal energy flowing toward the termination end circuit is absorbed and erased.

Further, when the driver circuit is connected with a branch line having a transmission line structure, a chip of a bus transceiver gate for opening only a gate of an active branch wire is inserted at a branch portion of the branch line, and the branch line has a characteristic impedance which is lower than, or is preferably ½ of that of the transmission line. Further, the chip of the bus transceiver gate is structured in a collected chip structure in which a plurality of buses of the transmission line are respectively connected through gates of their own, and is arranged obliquely so as to follow above the power-source/ground line.

In addition, in an electronic device according to the present invention, which relates to a two-way signal transmission structure, in which the transmission from the first integrated circuit chip to the second integrated circuit chip, and the transmission from the second integrated circuit chip to the first integrated circuit chip are combined with each other. A second integrated circuit chip, having a receiver circuit and a driver circuit of a current switch type, is branched from and connected to a bus of the transmission line. The first integrated circuit chip has a driver circuit and a receiver circuit having high impedance, and a complementary signal is bidirectionally transferred between the driver and receiver circuits of the first integrated circuit chip and the receiver and driver circuits of the second integrated circuit chip, respectively. As a result of this, it is possible to perform two-way signal transmission at a high speed between the first and second integrated circuit chips.

In this structure, a circuit, in which a resistor and a gate which have high impedance during outputting, and which become a matched end during inputting, are connected in series to an exit of a combination circuit of the driver and receiver circuits of the first integrated circuit chip, is inserted between the input and output ends of the transmission line.

Further, when the receiver circuit and driver circuit of the second integrated circuit chip are connected with a branch line of a transmission line structure, a chip in which a bus transceiver gate and a high resistor are connected in parallel is inserted into a branch portion of the branch line, and the bus transceiver gate is opened when the first integrated circuit chip is outputting, and the bus transceiver gate is closed when the first integrated circuit chip is inputting, so that energy is supplied to the high resistor.

In addition, in an electronic device according to the present invention, which relates to matching of clock timings with the transmission line, when a plurality of second to n-th integrated circuit chips are branched from and connected to the transmission line, the driver circuit of the first integrated circuit chip has a control function, and a timing is taken, when signals of several pulses travel through the transmission line, in a manner in which the first integrated circuit chip measures echo times of the second to n-th integrated circuit chips. A return-way active clock is supplied to an integrated circuit chip which has the longest echo time, the integrated circuit chip which is supplied with the return-way active clock detects a forward-way clock signal, the first integrated circuit chip generates a return-way clock signal, based on the detected return-way clock signal, and the integrated circuit chip, which is supplied with the return-way active clock, generates a data strobe signal in return. As a result of this, it is possible to match the timings of the transmission line and the clock signal between the first integrated circuit chip and the second to n-th integrated circuit chips.

In this structure, a timing of data to be received by the first integrated circuit chip is known in a manner in which, only when a control signal from the first integrated circuit chip is a read command, an integrated circuit chip which generates a return-way clock signal again receives a data strobe signal from the transmission line and issues the data strobe signal as a delayed data strobe signal in return.

In particular, in the electronic device described above, the transmission line is a differential transmission line which transmits a differential complementary signal, the driver circuit is a differential driver circuit, and the receiver circuit is a differential receiver circuit. Although the apparatus is mainly characterized by a differential transmission line, it is needless to say that the present invention is applicable if the apparatus is replaced with a normal transmission line. In addition, the first integrated circuit chip is a controller chip, connected to a starting end of the transmission line, and the second integrated circuit chip is a memory/input/output interface chip.

Thus, according to the electronic device as described above, in an input/output circuit which combines a driver with a bus wiring system comprising a transmission line and a termination end circuit matched with the transmission line, attenuation of signal energy during transmission can be restricted, and electromagnetic interference between adjacent transmission lines can be restricted by specifying the driver as a current switch type, as well as the transmission lines as parallel wires having an equal length which have a characteristic impedance of 25Ω or less. Therefore, it is possible to realize signal transmission at a higher speed in a bus wiring system.

Particularly, it is possible to improve signal transmission at a higher speed in one direction from a controller chip to a memory/input/output interface chip, or from a memory/input/output interface chip to a controller chip, or in both directions between a controller chip, which is connected to the starting end of a differential transmission line and has a differential driver and a memory/input/output interface chip, which is branched from and connected to the differential transmission line and has a differential receiver and a differential driver. It is therefore possible to provide an electronic device capable of realizing a high-speed transmission line in a bus wiring system.

BRIEF DESCRIPTION OF THE DRAWINGS

FIGS. 1(a) and 1(b) are schematic circuit diagrams showing an example of a driver circuit of a current switch type in which a transmission line is looped, in an electronic device according to an embodiment of the present invention, wherein FIG. 1(a) shows a case where the circuit is structured by a CMOS circuit, and FIG. 1(b) shows a case where the circuit is structured by a bipolar circuit.

FIGS. 2(a) and 2(b) are schematic cross-sectional views for explaining the thickness of an insulating layer between paired wires of a transmission line. FIGS. 2(a) and 2(b) are also an example of the spread of an electromagnetic field in an electronic device according to an embodiment of the present invention, wherein FIG. 2(a) shows a case where the paired wires are widely separated from each other, and FIG. 2(b) shows a case where the wires are close to each other.

FIGS. 3(a) and 3(b) are schematic conceptual views showing an example of a bus structure as a unit, in an electronic device according to an embodiment of the present invention, wherein FIG. 3(a) shows a basic bus structure, and FIG. 3(b) shows a branch structure which requires branch wires.

FIGS. 9(a) and 9(b) are schematic conceptual views and are equivalent circuit diagram showing an example of the structure of a one-way bus for transmitting a signal from a branch line to the differential receiver of a controller, in an electronic device according to an embodiment of the present invention, wherein FIG. 9(a) is a schematic conceptual view where a signal is sent in one direction from a branch line 9, and FIG. 9(b) is an equivalent circuit diagram one differential driver thereof is activated.

FIGS. 10(a) and 10(b) are schematic conceptual views and are equivalent circuit diagrams showing an example of a connection branch structure, based on a bus transceiver when a branch line requires a certain length, in an electronic device according to an embodiment of the present invention, wherein FIG. 10(a) is a schematic conceptual view showing the connection structure of a bus transceiver chip, and FIG. 10(b) is an equivalent circuit diagram thereof.

DESCRIPTIONS OF THE PREFERRED EMBODIMENTS

In the following, embodiments of the present invention will be explained in detail based on FIGS. 1 to 16. In all of the figures that explain the present invention, identical members are denoted at an identical reference symbol, and reiterative explanation of those members will be omitted herefrom.

Figure 1:
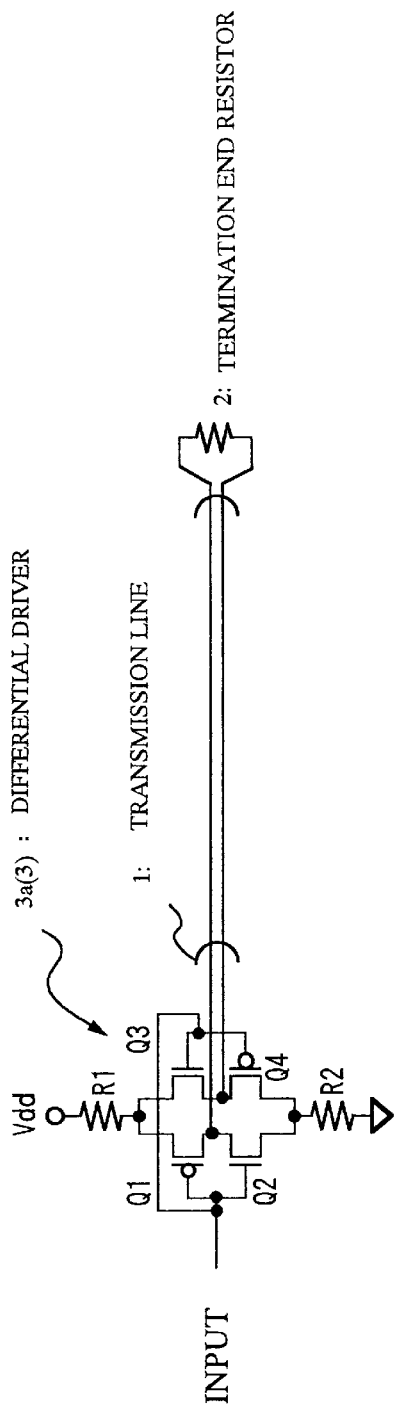
Figure 1:
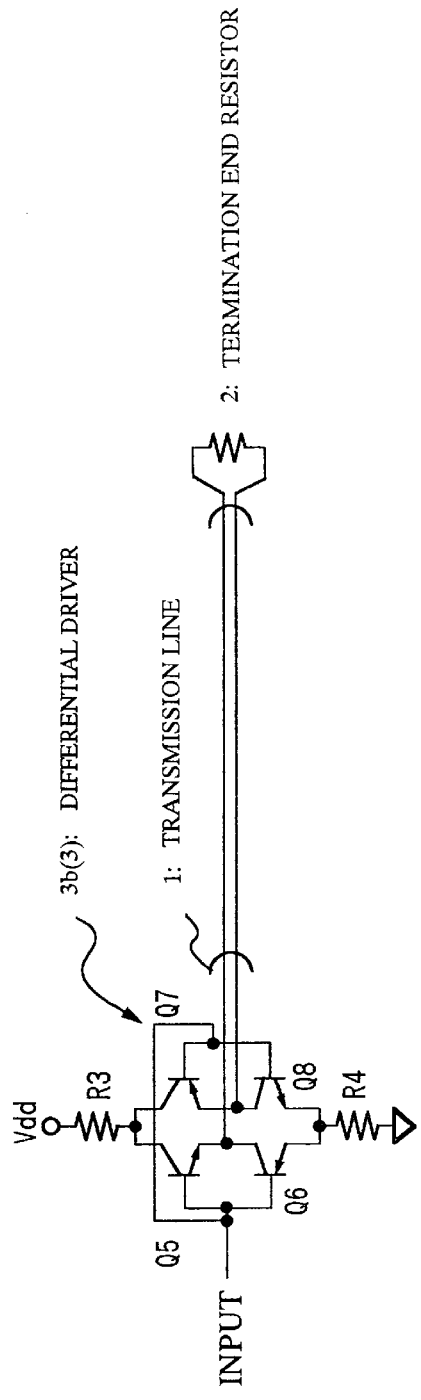

At first, an electronic device as an embodiment of the present invention will be schematically explained with reference to FIG. 1. FIG. 1 is a schematic circuit diagram showing an example of a driver circuit of a current switch type with a looped transmission line, as the main part of an input/output circuit in the electronic device, according to the present embodiment. FIG. 1(a) shows a case where the circuit is structured by a CMOS circuit, and FIG. 1(b) shows a case where the circuit is structured by a bipolar circuit.

As shown in FIG. 1, in the present embodiment, an input/output circuit is structured by combining a differential driver 3 of a current switch type with a bus wiring system comprising a transmission line 1 for transmitting a differential complementary digital signal, and a termination end resistor 2 as a termination circuit matched with the line. An integrated circuit chip, including the differential driver 3 and the like, is mounted on a wiring board including the transmission line 1, the termination resistor 2, and the like, thus structuring an electronic device. In this structure, if the transmission line 1 and the termination end resistor 2 are matched with each other, the load of the differential driver 3 can be regarded as a circuit, into which a direct current resistance equal to the termination end resistor 2 is inserted. In FIG. 1, this is substituted by a differential driver 3 of a current switch type.

As shown in FIG. 1(a), a differential driver 3a, based on a CMOS circuit structure, comprises a pMOS transistor Q1, an nMOS transistor Q2, an nMOS transistor Q3, a pMOS transistor Q4, a resistor R1 between them and a power source voltage Vdd, and a resistor R2 between them and a ground voltage. A digital signal as an input is inputted into the gates of the transistors Q1 to Q4. Complementary digital signals are respectively picked up from connection nodes between the pMOS transistor Q1 and the nMOS transistor Q2, and between the nMOS transistor Q3 and the pMOS transistor Q4, and are supplied to the transmission line 1 comprising differential paired signal wires which are connected to the termination end resistor 2.

As shown in FIG. 1(b), a differential driver 3b, based on a bipolar circuit structure, comprises an npn transistor Q5, a pnp transistor Q6, a pnp transistor Q7, an npn transistor Q8, a resistor R3 between them and a power source voltage Vdd, and a resistor R4 between them and a ground voltage. A digital signal as an input is inputted into the bases of the transistors Q5 to Q8. Complementary digital signals are respectively picked up from connection nodes between the npn transistor Q5 and the pnp transistor Q6, and between the pnp transistor Q7 and the npn transistor Q8, and are supplied to a transmission line 1 comprising differential paired signal wires which are connected to a termination end resistor 2.

An explanation will now be given mainly of the structure of the CMOS circuit shown in FIG. 1(a), although it will be the same with the bipolar circuit shown in FIG. 1(b). When a digital signal as an input shifts from a high level to a low level, the nMOS transistor Q2 and the nMOS transistor Q3 are turned on. Then, electric charges flow from the power source voltage Vdd to an upper signal wire as one of the transmission line 1, while charges are drawn from the other lower signal wire to the ground voltage. Accordingly, a current flows therebetween through the characteristic impedance of the transmission line, or through the termination end resistor 2. When the digital signal as an input shifts from a low level to a high level, the current inversely flows. If the ground voltage is observed from the side of the power source voltage Vdd, it is found that a constant current always flows and a form of a current switch is structured.

Since a current flows constantly, like an ECL (Emitter Coupled Logic), the resistors R1 and R2 should have appropriate resistance values, and a receiver capable of sensing a current which is as small as possible should be comprised, for example, this receiver can sense a transfer of a very small charge amount. Whether a CMOS or a bipolar circuit is more advantageous depends on the structure of the device. It is, however, difficult to reduce variance of the threshold voltage of a CMOS circuit. In addition, a bipolar circuit such as an ECL, which has actual achievements, is much more advantageous in avoiding the problem of the electrostatic breakdown of a very thin oxide film of gates. Also, a bipolar interface circuit is better in order to strengthen the circuit, which tends to easily cause electrostatic breakdown, because a clamp diode of a receiver which will be described later is removed and the depletion layer capacity thereof is also removed. Of course, inner circuits are CMOS circuits or the like, which are advantageous for integration.

As described above, for a first subject, the present embodiment is characterized by a chip input/output circuit which combines a differential driver 3 of a current switch type with a bus wiring system comprising a transmission line 1 and a termination resistor 2 matched with the line. Since this differential driver 3 is a current switch circuit, a constant current always flows through the power-source/ground system, and, therefore, this circuit has the advantage that no bypass capacitor is required. However, there are cases in which the current is switched in a transition state due to a delay on the transmission line 1, and in which a circuit in which a constant current is not obtained is used when driving a receiver. Therefore, it is suitable to insert a bypass capacitor into the input/output circuit system.

Next, a differential transmission circuit will be explained in relation to a bus wire structure based on the transmission line 1, with reference to FIG. 2. FIGS. 2(*a*) and 2(*b*) are schematic cross-sectional views for explaining the thickness of an insulating layer between the paired wires of the transmission line, and for explaining an example of the spread of the electromagnetic field thereof. FIG. 2(*a*) shows a case where the paired wires are widely separated from each other, and FIG. 2(*b*) shows a case where the wires are close to each other.

For example, in the case of differential paired signal wires led from a processor chip, a memory input/output controller chip, and a memory chip, over ten to several hundred wires must be wired approximately parallel to one another. Naturally, the layout is arranged such that the distance between adjacent lines is short, so the crosstalk between signal lines becomes large. If the spread of the electromagnetic field to the signal transmission of the differential paired signal wires is reduced, the crosstalk becomes small. To realize this, the vertical distance between opposed upper and lower paired wires is set to be relatively smaller than the space between adjacent signal lines, for example, the thickness of the insulating layer between the upper and lower wires of each pair of signal wires is set to be small. Although it may be proposed that the width of the signal wire should be set to be smaller than the space, the increase of the direct current resistance due to a skin effect is involved, undesirably.

That is, in the case where the thickness of the insulating layer 5 between the paired wires 4 is large, as shown in FIG. 2(*a*), the fringe effect is large so that the spread 6 of the electromagnetic field is also large, and interference with the electromagnetic field occurs. However, as shown in FIG. 2(*b*), if the interlayer insulating film between the paired wires 4 is set to be thin, with the wire width of each of the paired wires 4 kept unchanged, the electromagnetic field is concentrated between the paired wires 4 so that electromagnetic interference is eliminated substantially, and the characteristic impedance of the paired wires 4 becomes small.

Figure 18:
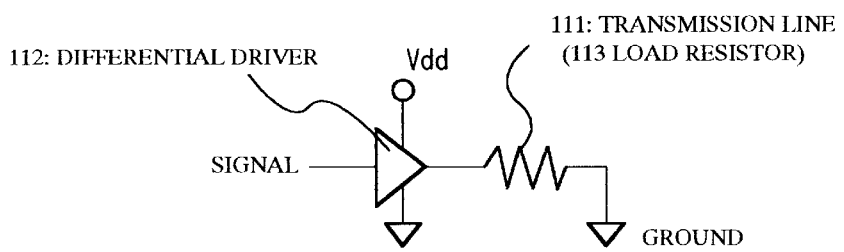
FIG. 18 is an equivalent circuit diagram showing the state from the start of the transition of a signal until the completion of transmission to a bus termination end, in an electronic device which is a prerequisite to the present invention.
Figure 19:
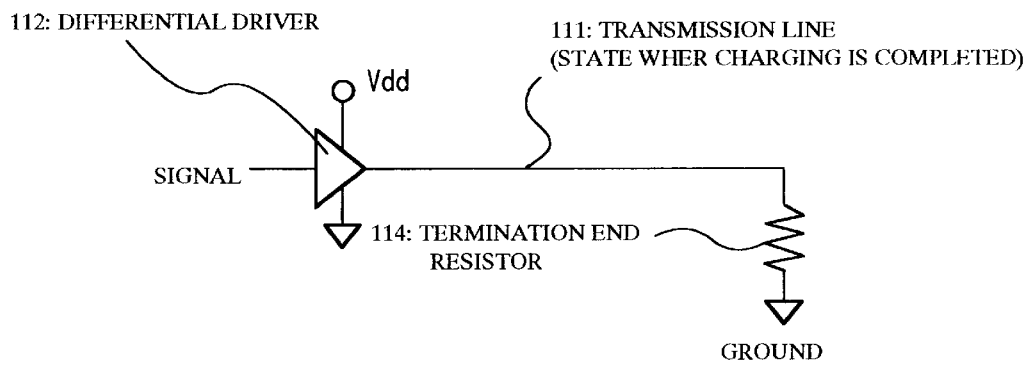
FIG. 19 is an equivalent circuit diagram showing the state after a signal has reached a termination end resistor, in an electronic device which is a prerequisite to the present invention.

However, the paired wires 4, whose characteristic impedance is thus reduced, involve a current flow increased by the amount equivalent to the resistance. To prevent this, a differential driver may be used, into which a direct current resistor having a much higher impedance is inserted. For example, supposing that the characteristic impedance of the paired wires 4 is 15Ω in the circuit state shown in FIG. 18, described previously, the total resistance of the current bus system of the differential driver 3 may be set to 85Ω, in order to obtain 5 mA (amplitude of 0.5 V). Naturally, matching with the state shown in FIG. 19, previously described, must occur, so that the termination end resistor 2 is of 15Ω.

Conventionally, characteristic impedance of 50Ω or 75Ω is commonly used, and this is a setting for preventing current loss. If a securely matched termination end is prepared, energy is not reflected at all, and the reflected wave which returns to the differential driver 3 is 0. As long as this is satisfied, characteristic impedance of 25Ω or less can be set without problems. Accordingly, to realize low characteristic impedance with use of the transmission line 1 for differential signals, it is necessary to structure paired wires 4, which are opposed to each other, with a thin insulating layer inserted therebetween, as shown in FIG. 2(*b*). The thinner the insulating layer 5, the smaller the characteristic impedance.

For example, an approximate expression of characteristic impedance Zo is as follows.
[Math 1]

$$Zo=(h/w)\times\sqrt{\mu o^*\mu r/\epsilon o^*\epsilon r}=377\times(h/W)/\sqrt{\epsilon r}$$

In this expression, w is wire width, h is insulating layer thickness, $\mu o$ is permeability, $\mu r$ is relative permeability, $\epsilon o$ is a dielectric constant, and $\epsilon r$ is a relative dielectric constant.

Thus, in the present embodiment, by thinning the insulating layer 5 between the paired wires 4, the electromagnetic waves can be reduced even more, the crosstalk between adjacent lines is restricted, the paired wires are held as a sub-TEM transmission line 1, and resonance and reflection are eliminated, so that the apparatus becomes more advantageous in all respects.

Next, with reference to FIG. 3, an explanation will be given of a structure for branching a number of differential receivers on a bus of the transmission line 1. FIGS. 3(*a*) and 3(*b*) are schematic conceptual views showing an example of one unit of a bus structure. FIG. 3(*a*) shows a basic bus structure, and FIG. 3(*b*) shows a branch structure which requires branch wires. In the paired wires 4, the wire indicated by a broken line is positioned under the wire indicated by a continuous line and having an opposite phase. Although one pair of wires 4 is illustrated, a bus for practical use is structured by a structure in which several ten of pairs to several hundred pairs of wires are arranged in parallel to each other.

As shown in FIG. 3(*a*), a large number of differential receivers 7 must be branched from the base of the transmission line 1. As described above, as a condition which the paired wires 4 must satisfy as a transmission line 1 of sub-TEM, the impedance of the differential receiver 7 must be a high direct resistance component. Therefore, it is necessary to use an equipment form in which the length of branched wires is very short, for example, to a pair chip equipment form. In the differential receiver 7, the gate capacity must be set to 0.05 pF or less, although a CMOS gate may be used. In this case, it is not preferable to insert a clump diode. Also, in a bipolar circuit, the input capacity, including a depletion layer of the base, must be set to 0.05 pF or less. As a method for reducing the depletion layer capacity, a SOI (Silicon On Insulator) structure is used, and a structure which realizes this is also included in the present invention.

Since realization of 0.05 pF or less is difficult, a resistor 8 of 0.4 to 1 kΩ or so is inserted at an end portion of the differential receiver 7 in the present embodiment, as shown in FIG. 3(*a*). Therefore, although the differential receiver 7 has a relatively large capacity, an introduced current is small, so that influences onto the paired wires 4 are almost eliminated. In this respect, if one hundred differential receivers 7 are branched, the voltage waveform is attenuated by 100/1 to 4 kΩ=10 to 25%, and involves no problems with signal transmission since the waveform is not deformed.

In addition, the capacity of the differential receiver 7 must be set to 1 to 2.5 pF or less, in order to guarantee the rising and falling of time constant 1 ns, since the response must be quick at a small current. The voltage v, which changes at this time, is as follows.
[Math 2]

$$v = V_0 \times \exp(-t/R^*C)$$

In this equation, v(ts)=0.63 Vo where R is resistance, C is load capacity, t is elapsed time, and the time constant ts is equal to RC. Vo is the maximum amplitude of the signal inputted into the branch circuit. However, it is possible to adopt a differential receiver 7, which is larger by one digit. In this case, the capacity of 0.2 to 0.5 pF must be realized at the rising of the time constant 0.2 ps. These values are within a possible range as a receiver capacity of an integrated circuit chip, if there is no package wire.

If a certain length is necessary for the branch line 9 for the differential receiver 7, parasitic reactance can be eliminated and transmission can be achieved by arranging the branch line in a transmission line structure of sub-TEM, as shown in FIG. 3(b). If the capacity is reduced from the wiring system of the branch line 9, there are great effects, and there is an advantage in that only the gate capacity or base capacity of an input circuit exists. The characteristic impedance may be high characteristic impedance, within a range in which interference is not caused with adjacent branches. In any case, total reflection occurs at the end portion of the differential receiver 7 and v(ts)=2Vo is satisfied, so that the transition time 0.5 ns is reduced to 0.25 ns. Thus, ½ reduction is achieved. Although multiple reflection occurs within the line of the branch line 9 in this case, the lowermost resonance frequency is as high as 4.7 GHz (=1.5 m/s (optical velocity)/0.04 m×8, ⅛, where ¼wavelength is added to the reciprocal wires) without problems, if the line is as short as 4 mm or less.

Here, a second point, explained above, will be summarized as follows. The second point is characterized by a bus structure in which lines, each having characteristic impedance of 25Ω or less and having an equal length, are wired in parallel and terminated at the termination end resistor 2 of 25Ω or less, in a structure of opposed paired wires 4 like those in the cross-sectional structure shown in FIGS. 2(a) and 2(b) which are structured by the transmission line 1. Further, the differential driver 3 is an ON-resistance which is equivalent to or more than the characteristic impedance of the transmission line 1, and preferably is three or more times as large as the characteristic impedance. Namely, a pure resistance is connected in series to the differential driver 3 so that it becomes an appropriate ON-resistance. In addition, the differential receiver 7, connected to the bus of the transmission line 1, is characterized by high impedance and must satisfy the condition that the pure resistance is 1 kΩ or more. Further, the structure is characterized in that a resistor 8 of 0.4 to 1 kΩ is connected in series to both of the paired wires 10 at the branch section when a differential receiver 7 of high impedance is connected to an arbitrary position on the bus through a branch line 9 of 4 mm or less having a transmission line structure. This principle structure will be as shown in FIG. 1, and lines, each comprising this principle structure as a basic unit, are wired in parallel at an equal length in the bus structure (as shown in FIGS. 2(a) and 2(b) previously described). In addition, the branch structure of the differential receiver 7 is as shown in FIG. 3.

Figure 4:
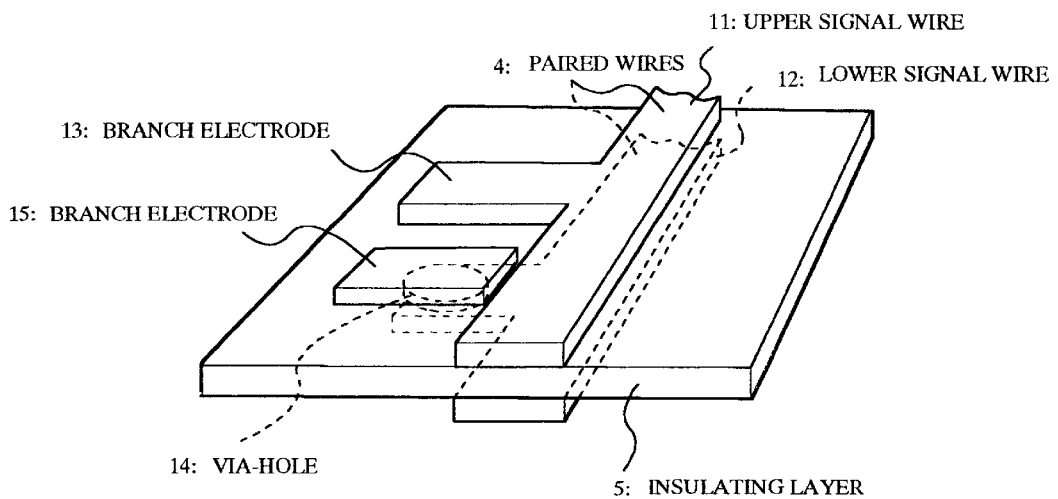
FIG. 4 is a schematic perspective view showing an example of a branch structure of a differential receiver, in an electronic device according to an embodiment of the present invention.
Figure 5:
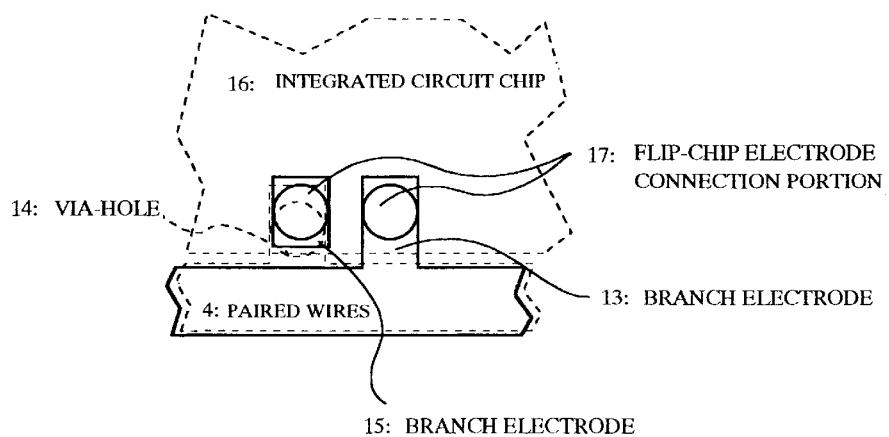
FIG. 5 is a schematic plan view showing an example of a basic bus structure, corresponding to FIG. 3(a), in an electronic device according to an embodiment of the present invention.
Figure 6:
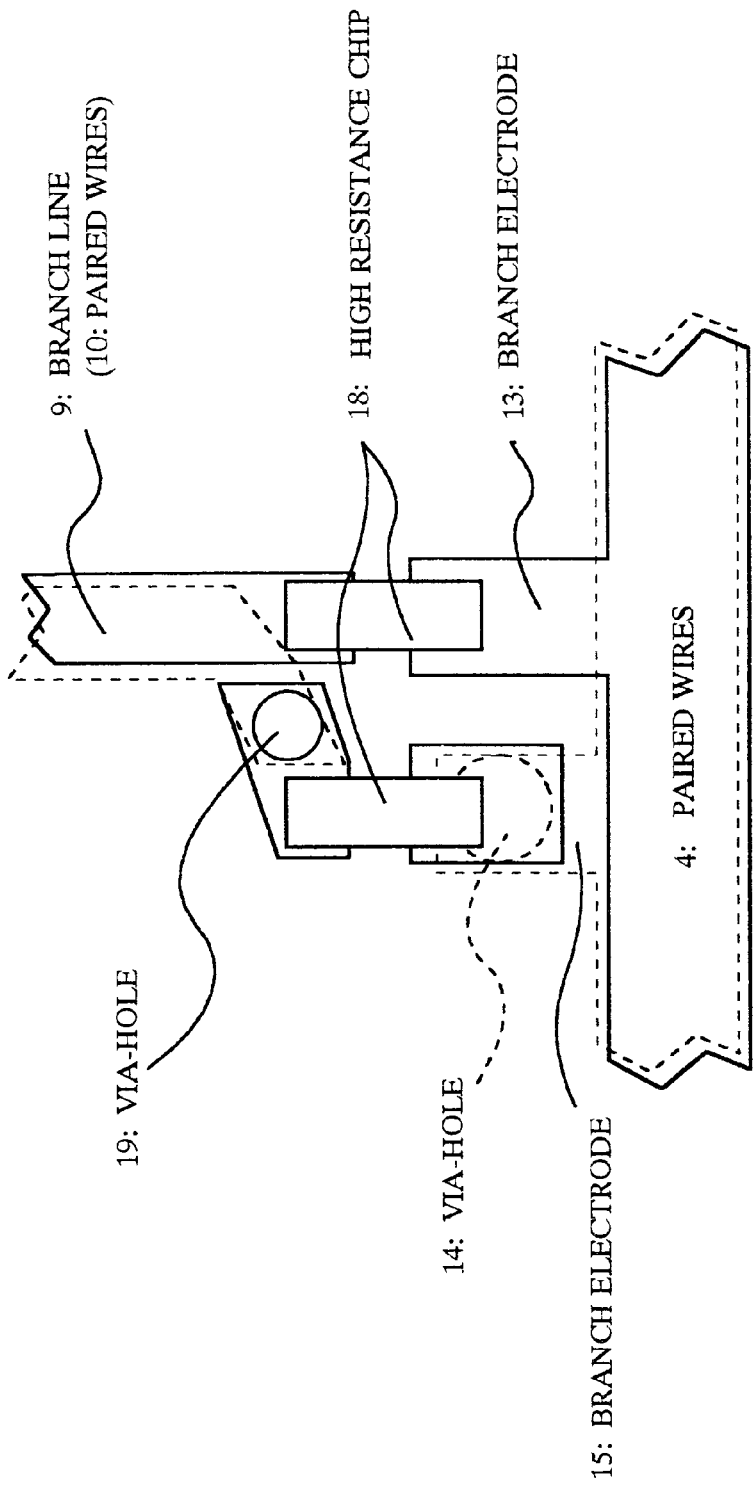
FIG. 6 is a schematic plan view showing an example of a branch structure which requires a branch line, corresponding to FIG. 3(a), in an electronic device according to an embodiment of the present invention.

Next, a specific example of the differential receiver 7 will be explained with reference to FIGS. 4 to 6. FIG. 4 is a schematic perspective view showing an example of a branch structure of the differential receiver 7. FIG. 5 is a schematic plan view showing an example of a basic bus structure corresponding to the FIG. 3(a), previously explained. FIG. 6 is a schematic plan view showing an example of a branch structure which requires branch wires 9, corresponding to FIG. 3(b).

As shown in FIG. 4, the opposed paired wires 4 of the transmission line 1 comprise an upper signal wire 11 in the side where integrated circuit chips of the differential receiver 7 are equipped, interposing the insulating layer 5 therebetween; and a lower signal wire 12 in the opposite side. The upper signal wire 11 is provided with a branch electrode 13 branched therefrom, and the lower signal wire 12 is provided with a branch electrode 15 at an upper portion through a via-hole opened in the insulating layer 5. The structure is arranged such that the integrated circuit chip of the differential receiver 7 is equipped on these branch electrodes 13 and 15.

To implement the integrated circuit chip of this differential receiver 7, two cases will be discussed. In one case as shown FIG. 5, flip chip contact portions 17 of the integrated circuit chip 16 are directly provided on and electrically connected to the branch electrodes 13 and 15 which are connected to the upper and lower signal wires 11 and 12 of the opposed paired wires 4. In another case, as shown in FIG. 6, high resistance chips 16 are respectively provided between the branch electrodes 13 and 15 and the paired wires 10 of the branch wires 9, the branch electrodes 13 and 15 being connected to the upper and lower signal wires 11 and 12 of the opposed paired wires 4, so that the paired wires 4 are electrically connected to the differential receiver 7 of the integrated circuit chip 16. When providing the high resistance chips 18, as shown in FIG. 6, the wire connected to the lower signal wire of the paired wires 10 is extended through a via-hole from the upper side.

Figure 7:
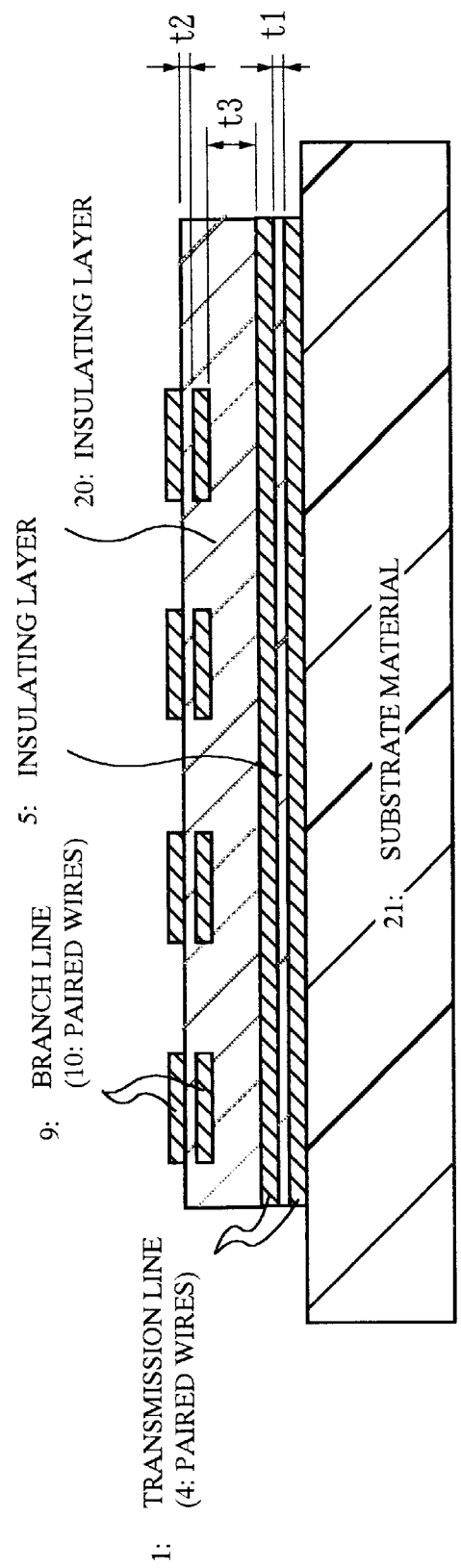
FIG. 7 is a schematic cross-sectional view showing an example of a wire layer structure comprising four layers, in an electronic device according to an embodiment of the present invention.

Next, the wiring layer structure between the transmission line 1 and the branch wires 9 will be explained with reference to FIG. 7. FIG. 7 is a schematic cross-sectional view showing an example of a wire layer structure comprising four layers, in an electronic device according to an embodiment of the present invention.

In the wiring layer structure between the paired wires 4 of the transmission line 1 and the paired wires 10 of the branch wires 9, branching is achieved naturally by a multi-layer structure when there are more than ten to several hundred opposed paired wires 4. As shown in FIG. 7, the multi-layer structure can be structured in a manner in which the uppermost layer (first layer) and the lower layer (second layer) thereof are wire layers of the branch line 9, and the third and fourth layers are bus wire layers of the transmission line 1. In this four-layer structure, the thickness t1 of the insulating layer 5 between the opposed paired wires 4 of the bus is about 1 to 5 μm, and the same is the case with the thickness t2 of the insulating layer between the opposed paired wires 10 of the branch line 9. In addition, since the bus of the transmission line 1 and the branch line 9 cross each other perpendicularly, the thickness t3 of the insulating layer 20 inserted therebetween may be about two to twenty times greater in order to reduce the crosstalk between the lines. However, if the length of the via-hole is enlarged, it is considered to be mismatched wiring, which causes an electromagnetic disturbance. It is hence preferable that the thickness t3is set to be several times greater. Although FIG. 7 shows no wire provided under the substrate material 21, a return wire may be provided from the upper side to the lower side.

Figure 8:
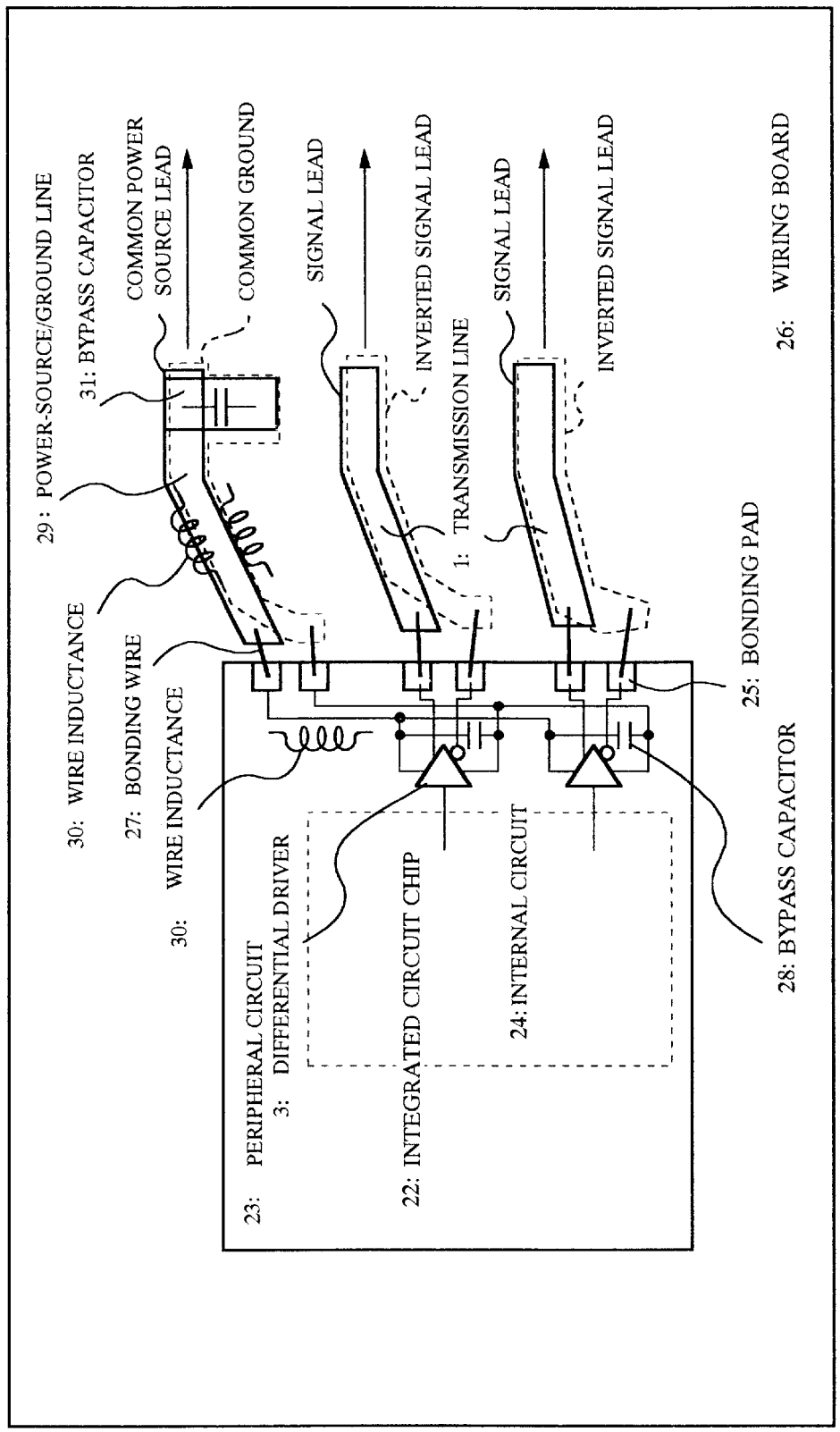
FIG. 8 is a schematic layout view showing an example of a fan-out structure of an integrated circuit chip of a differential driver, and a layout of a bypass capacitor, in an electronic device according to an embodiment of the present invention.

Next, the section to be fanned out from the integrated circuit chip of the differential driver 3 will be explained with reference to FIG. 8. FIG. 8 is a schematic layout view showing an example of a fan-out structure of the integrated circuit chip of the differential driver 3, and a layout of a bypass capacitor.

As shown in FIG. 8, the integrated circuit chip 22 of the differential driver 3 comprises a peripheral circuit 23 including an input/output circuit, such as a differential driver 3 and the like, and an internal circuit 24 connected to the peripheral circuit 23. At an outer end portion of the peripheral circuit 23, bonding pads 25 are provided to make the connection with the outside of the integrated circuit chip 22. This integrated circuit chip 22 is equipped on the main surface of a wiring board 26 in which transmission lines 1 are formed, and the transmission lines 1 are electrically connected to the bonding pads 25 through bonding wires 27, based on wire bonding.

In the fan-out structure of this integrated circuit chip 22, the opposed paired wires of the transmission line 1 are formed immediately after the bonding wires 27, based on wire bonding, onto the bonding pads 25 in order to be fanned out to have same width, so that the characteristic impedance is kept constant. In addition, a bypass capacitor 28 is inserted near the differential driver 3, and a power-source/ground line 29, based on a common power source lead (in the upper side) and a common ground lead (in the lower side) for a power source voltage and a ground voltage for driving the differential driver 3 is also inserted. This fan-out structure naturally extends in the direction of the arrows ("→" to the right side) in FIG. 8, and the transmission line 1, comprising a signal lead and an inverted signal that are paired with each other, is connected to the termination end resistor 2.

In addition, since this differential driver 3 creates a mirror-image-like signal change, a mirror-image-like transfer of charges occurs in the power-source/ground line 29. Therefore, electromagnetic disturbance can be prevented by structuring the power-source/ground line 29 by paired wires. That is, wires which causes no reactance are formed, and the wire inductance 30, as shown in FIG. 8, can be eliminated. In this structure, a space margin is formed after the fan out, and therefore, a bypass capacitor 31 is inserted at the portion of the space margin. In addition, as a preferable example, the differential receiver 7, which is connected and branched from the transmission line 1, should be a circuit which performs a mirror-image-like transfer of charges and can be obtained by a power-source/ground line based on paired leads.

In this fan-out structure, the characteristic impedance of the paired wires of the signal wires is 15Ω. However, since the direct current resistance of the differential driver 3 is large, 15Ω is sufficient as the characteristic impedance of the power-source/ground line 29 of the paired leads. Preferably, the characteristic impedance must be further reduced, and therefore, the wire width should be two times(7.5Ω), four times(3.25Ω), six times(2.5Ω), or more times greater than that of the signal wires (where Vdd is 3.3 V, and an ability of current of 100 mA is constantly obtained under a voltage drop condition of 7.5%). When the signal wire has a width of 10 μm, 20, 40, 60, . . . μm can be obtained sufficiently. As a result of this, one power-source/ground line 29 of paired leads can cover 8 to 16 pairs of signal wires. In addition, 32 to 64 pairs can be achieved by adopting a bypass capacitor. At this time, the power-source/ground line in the integrated circuit chip 22 is long, and therefore, the structure of paired wires should preferably be adopted so as to obtain equal impedance. As a result of this, the ability to supply the internal circuit with a power is attained.

Here, the third point will be summarized as follows. The third point is characterized in that the wires for the power source voltage and the ground voltage are structured in a transmission line structure using a voltage-source/ground line 29 of paired leads, also, this third point is combined with the first and second points. Further, the characteristic impedance of the transmission line of the power-source/ground line 29 of paired leads is equivalent to or lower than the characteristic impedance of the signal wires.

Next, the structure of the differential receiver 7, branched from the transmission line 1, will be specifically explained with reference to FIG. 9. FIGS. 9(a) and 9(b) are views showing an example of the structure of a one-way bus which transmits a signal to a differential receiver of a controller from a branch line 9. FIG. 9(a) is a schematic conceptual view where a signal is sent in one direction from a branch line 9, and FIG. 9(b) is an equivalent circuit diagram of when one differential driver thereof is activated.

Conventionally, a differential driver 3 connected to a transmission line 1 of a bus is a memory controller or a bus controller in a practical electronic device. Meanwhile, the differential receiver 7 is a memory chip or an input/output interface chip for graphic use or the like. Naturally, data output from the memory chip and an interface chip is required, and chips from this group have differential drivers and output signals. The structure shown in FIGS. 1 to 8 is a one-way bus in which signals are always transferred from the differential driver 3 to the differential receiver 7. In contrast, when the group of chips, such as a memory chip, an interface chip, and the like, for example, a branch port becomes a differential driver, the signal transmission structure of this bus wiring system is completed if a similar transmission line circuit of a one-way bus is formed.

Therefore, as shown in FIG. 9, a structure is taken into consideration in which a differential driver 44 of a memory/input/output-interface 43, such as an integrated circuit chip, is connected to a bus wiring system where a differential receiver 42 of a controller chip 41, such as an integrated circuit chip, is connected to the start end of a transmission line 1, and where a termination end resistor 2 is connected to the termination end thereof. The structure will then be as follows. FIG. 9(a) shows an example where the differential driver 44 at the left end, which is connected to a branch line 9 of the transmission line 1, is activated. The wire indicated by a broken line of the paired wires 4 is a wire having an opposite phase, which is positioned below the wire indicated by a continuous line.

Also, in this structure, a differential driver 44 of a current switch type, like that in the structure previously explained with reference to FIGS. 1 to 8, is attached to the memory/input/output-interface chip 43 of the branch chip. If outputted therefrom, a signal flows through opposed paired wires 4. A part of this signal reaches the differential receiver 42 of the controller chip 41, and this differential receiver 42 senses the arrival of the part. An equivalent circuit thereof is shown in FIG. 9(b). Also, the differential driver 44 of the memory/input/output interface chip 43 should preferably be of a bipolar system in many cases, as described previously, although the figure shows a current switch circuit based on a CMOS circuit structure comprising a pMOS transistor Q41, an nMOS transistor Q42, an nMOS transistor Q43, a pMOS transistor Q44, a resistor R41 between them and a power source voltage Vdd, and a resistor R42 between them and a ground voltage.

In this structure, when the signal from the differential driver 44 of the memory/input/output interface chip 43 flows through the transmission line 1 of the bus wiring system, the current flows in the lateral direction of the paired wires 4, and therefore, the height of the waveform of the travelling wave is ½ of that of the output waveform. The waveform of the travelling wave flowing toward the right side completely disappears when the wave reaches the termination resistor 2 matched with the transmission line 1 and is completely radiated in the form of heat.

Meanwhile, the waveform of the travelling wave flowing toward the left side reaches the differential receiver 42 of the controller chip 41, and this wave is totally reflected, since the load resistor 45 of this differential receiver 42 has an impedance as high as several kΩ to 1 MΩ or so, and can be approximate to an open ended line, as compared with 15Ω of the transmission line 1. Therefore, the voltage waveform of the load end of the differential receiver 42 creates a waveform having an amplitude substantially similar to the waveform outputted from the differential driver 44. Further, the waveform thus reflected flows toward the right side and disappears in the form of heat at the termination end resistor 2. It will be easily understood that the result in the same if any of the branch chips are activated. Although only one pair of paired wires 4 is illustrated in FIG. 9, it is needless to say that an actual bus has a structure in which more than ten to several hundred pairs of paired wires are arranged in parallel.

Further, when the branch line 9 requires a certain length, as in the case described above, the branch line is structured in a transmission line structure. If only the timings are matched, waveform transmission as shown in FIG. 9(b) can be guaranteed, however long the branch line 9 is. However, since there are many branch lines 9, there is a possibility that energy can be drawn every time that an effective signal passes through a branch point, and the amplitude is thereby decreased as a result, so that the threshold value of the differential receiver 42 cannot be exceeded. Therefore, a structure in which a bus transceiver chip is inserted into a branch point is adopted.

Next, the case in which a bus transceiver chip is inserted into the branch point of the branch line 9 will be explained with reference to FIG. 10. FIGS. 10(a) and 10(b) are views showing an example of a connection branch structure based on a bus transceiver when a certain length is necessary for the branch line 9. FIG. 10(a) is a schematic conceptual view showing the connection structure of a bus transceiver chip, and FIG. 10(b) is an equivalent circuit diagram thereof.

In the connection structure of the bus transceiver chip 46, as shown in FIG. 10(a), the uppermost two layers are wire layers of the branch line 9 comprising opposed paired wires 10, and the two lower layers (third and fourth layers) thereunder are bus wire layers of the transmission line 1 comprising opposed paired wires 4. Further, a power source line comprising leads of the power-source/ground line 29 of the bus transceiver chip 46 comprises the lower layers (fifth and sixth layers) thereunder, and is provided obliquely along the connection points from which wires are branched to parallel bus lines. A single chip of the bus transceiver chip 46 is connected to the connection terminal portion by a flip-chip connection. In addition, wires for a chip enable signal are provided in the wire layers of the branch line 9. In order to supply electric energy to the differential amplifier of this single chip, connection is made from the wire layers of the power-source/ground line 29 to the bus transceiver chip 46 through via-holes by a flip-chip connection although that is not shown in the figure.

An equivalent circuit of this connection structure will be as shown in FIG. 10(b). A switch based on the nMOS transistors Q45 and Q46n operates with respect to both the differential bus wires of the transmission line 1. When a differential enable signal is activated, the signal from the branch line 9 flows to the transmission line 1 of the bus. Although this state is attained only when the driver to which the memory/input/output-interface chip is attached is activated, the enable signal is normally non-active and the gates of the nMOS transistors Q45 and Q46 of the bus transceiver chip 46 are closed. At this time, the impedance becomes several kΩ to 1 MΩ or so, and is shut off from the transmission line 1 of the bus. Connection to the power-source/ground line 29 for driving the enable signal buffer 47 of the bus transceiver chip 46 is also omitted herefrom, but can be readily understood.

In this connection structure, the branch line 9 is a transmission line, and in the transmission line 1 of the bus wire viewed from this wire, there appears to be ½ of the characteristic impedance of the bus wire, since energy flows to both sides. Therefore, to prevent reflection at the connection portion of the bus wire, the branch line 9 should preferably have a characteristic impedance of ½ of that of the bus wire. However, if the wire is short, influences from reflection noise are attenuated within a signal transition period and do not cause a significant problem. Therefore, matching conditions are not always required. Accordingly, a preferable condition will be that it is equal to or lower than the characteristic impedance of the transmission line 1 of the bus wire. Since the bus transceiver chip 46 can be formed by one transistor, high-speed operation is enabled and it is possible to follow a high-speed signal.

As will be understood from the above explanation, the fourth point of the present embodiment defines the circuit configuration and also the structure when a signal is allowed to flow from an memory/input/output interface chip 43 of a branch chip connected to a transmission line 1 of differential bus wires, to a controller chip 41 connected to a start end of the differential bus wires. That is, the differential driver 44 of the branch chip is a current switch circuit, and has the same characteristics as the differential driver of the controller chip 41. Although the amplitude of this differential driver 44 is the same as that of the controller chip 41, transmission of a signal from the branch line 9 to the transmission line 1 is basically achieved in the form of a T-shaped branch, and therefore, the signal flows to both sides, divided by 2 when the signal flows into the bus wire. However, at the end portion of the differential receiver 42, the signal energy is totally reflected and the original amplitude is recovered, so that the differential receiver 42 operates normally. In addition, to eliminate the signal energy flowing to the termination end side, a termination resistor, based on a direct resistance matched with this characteristic impedance, is connected in series to the termination end of the differential bus wires.

Further, since the differential bus wires have the characteristic impedance of 25Ω or less, the differential driver 44 of the current switch circuit is characterized in that an appropriate direct current resistance is inserted into the power source side and the ground side, in order to save the current. In addition, when a branch chip exists directly on the differential bus wires, it is characterized in that the circuit of the bus transceiver chip 46 is provided in the branch chip. Also, when a branch chip is not mounted on the differential bus wires and the branch line 9 requires a certain length, a structure is provided in which a bus transceiver chip 46 is inserted at the branch end. The branch wire 9 is characterized by having an impedance which is lower than that of the bus, or is preferably ½ thereof.

That is, since only the gates of an active branch line 9 are opened, a structure in which a bus transceiver chip 46 is equipped on a pad near a via-hole of the branch line 9 on the main line is added, so that the line length of the branch line 9 can be freely adjusted if the timings are arranged. In addition, as for the bus transceiver chip 46, a small chip for every one transmission line can be connected by a flip-chip connection, and also, it is possible to adopt a collected chip structure (or an elongated chip) in which a plurality of buses are respectively connected by their gates. In this case, the buses are arranged obliquely so as to follow the upper side of the power line in FIG. 10(a).

In the above, the point shown in FIGS. 1 to 8 defines the method of transmitting a signal from a controller chip 41 to a branch chip, such as a memory/input/output-interface chip or the like, and the point shown in FIGS. 9 and 10 defines the method of transmitting a signal from the branch chip to the controller chip 41. That is, each of the points relates to a one-way (or one-directional) transmission bus. The following will propose a structure which defines transmission, which combines both methods.

Figure 11:
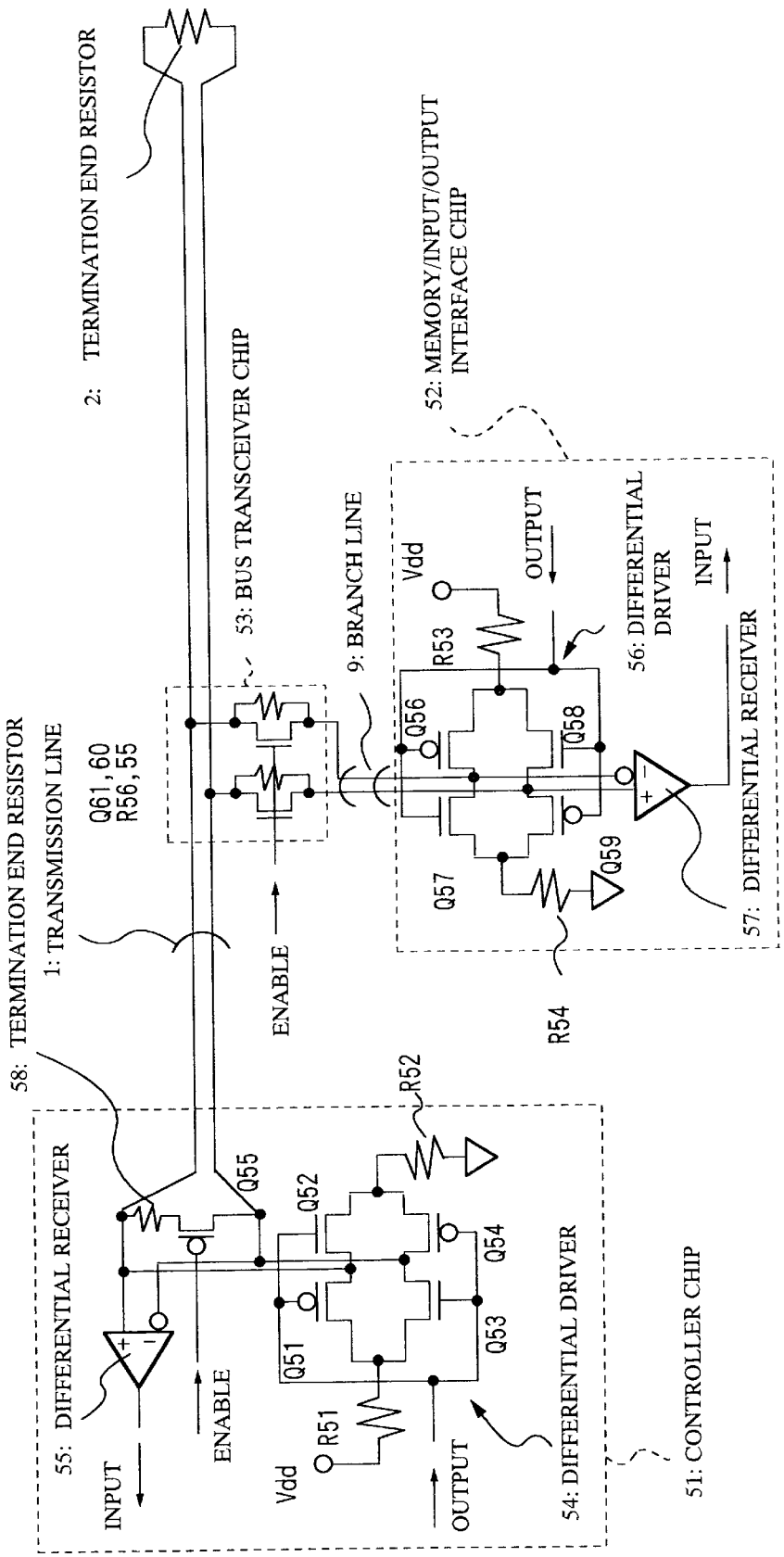
FIG. 11 is a schematic circuit diagram showing an example of a reciprocal transmission line and an input/output circuit thereof, in an electronic device according to an embodiment of the present invention.

Next, with reference to FIG. 11, a reciprocal signal transmission bus structure which combines one-way signal transmission bus structures will be explained. FIG. 11 is a schematic circuit diagram showing an example of a reciprocal transmission line and an input/output circuit thereof.

In FIG. 11, a controller chip 51 and a memory/input/output interface chip 52 are connected to each other through a transmission line 1 based on differential paired wires, with a bus transceiver chip 53 inserted therebetween. In this connection, circuits that respectively separate the differential drivers 54 and 56 of the controller chip 51 and the memory/input/output interface chip 52 from the differential receivers 55 and 57 are omitted because those circuits are complicated. Transistor gates that are conventionally used may be inserted.

In the controller chip 51, the differential driver 54 is structured by a current switch circuit, based on a CMOS circuit structure which comprises a pMOS transistor Q51, an nMOS transistor Q52, an nMOS transistor Q53, a pMOS transistor Q54, a resistor R51 between them and a power source voltage vdd, and a resistor R52 between them and a ground voltage, as described previously. The differential receiver 55 is structured by a differential sense amplifier, and a pMOS transistor Q55 is connected to the input end of the differential sense amplifier through a termination resistor 58.

In the memory/input/output interface chip 52, the differential driver 56 is structured by a current switch circuit, based on a CMOS circuit structure which comprises a pMOS transistor Q56, an nMOS transistor Q57, an nMOS transistor Q58, a pMOS transistor Q59, a resistor R53 between them and a power source voltage Vdd, and a resistor R54 between them and a ground voltage, as described previously. In addition, the differential receiver 57 is structured by a differential sense amplifier.

The bus transceiver chip 53 is connected between the transmission line 1, based on differential paired wires connected to the controller chip 51 and the branch line 9, also based on differential paired wires connected to the memory/input/output interface chip 52. The bus transceiver chip 53 comprises nMOS transistors Q60 and Q61, which are respectively connected to the paired wires and are in parallel with each other, and resistors R55 and R56 for taking in branched energy.

In this connection structure, when the output circuit based on the differential driver 54 of the controller chip 51 is active, the enable signal is high and the pMOS transistor Q55 connected thereto is off, so this portion has high impedance, and the energy of the differential driver 54 is outputted to the transmission line 1 without any change. This signal is inputted into the branch line 9 through the resistors R55 and R56 of the bus transceiver chip 53 which is connected to the memory/input/output interface chip 52, thereby operating the sense amplifier as the differential receiver 57 connected to the termination end of the branch line so that an input is obtained. The energy flowing through the bus, based on the transmission line 1, is absorbed as a heat by the termination end resistor 2 at the right end and is not reflected.

Similarly, when the memory/input/output interface chip 52 serves as a driver, the current switch of the differential driver 56 operates, and energy is outputted to the branch line 9. At this time, the nMOS transistors Q60 and Q61 of the bus transceiver chip 53 are turned on, and the energy is split between both ends of the transmission line 1 based on differential paired wires, as shown in FIG. 9(b) previously described. The signal flowing toward the right side is absorbed by the termination resistor 2, and disappears. The signal flowing toward the left side is taken in by the differential receiver 55 of the controller chip 51, and is thus inputted. However, since the sense amplifier has high impedance, the signal is totally reflected and a dead signal flows to the right.

Since such a dead signal floats on the transmission line 1, signals from the respective chips are mixed with each other, making it difficult to match the timings. To prevent this, a termination resistor 58 is inserted which makes the end portion of the controller chip 51 a matched end. When a signal is inputted to the controller chip 51, the pMOS transistor Q55 of the enable signal is turned on, and the termination end resistor 58 attached in series thereto works, so that most of the energy is not reflected but is thereby absorbed. Although the voltage between both ends of the termination end resistor 58 is sensed by the sense amplifier of the differential receiver 55, the sense amplifier takes in a signal whose amplitude is reduced to half of the amplitude at the differential driver 56, and therefore, enough sensitivity to sense such a signal is required.

To summarize the fifth point from the above description, the present embodiment defines the structure in which the transmission line 1 is a reciprocal line. This is a combination of the circuit shown in FIGS. 1 to 8 and the circuit shown in FIGS. 9 and 10. The connection between the differential driver 56 and the differential receiver 57 is made by gates, and high impedance separation can be achieved. Since the signals are mixed in this reciprocal circuit, this case is characterized in that a measure is taken to reduce floating transmission of dead signals, so that the transmission state of the transmission line 1 might not be disturbed. That is, this object can be achieved by inserting, into the input and output ends of the transmission line 1, a circuit in which a termination end resistor 58, which has high impedance during output and becomes a matched end during input, and a gate based on the pMOS transistor 55 are connected in series to the exit of the combination circuit of the differential driver 54 and the differential driver 55 in the controller chip 51.

Further, the gates based on the nMOS transistors Q60 and Q61 of the bus transceiver chip 53 and the resistors R55 and R56 are connected in parallel to the pads near the via-hole of the branch line 9. The gates are opened during the output from the memory/input/output interface chip 52 as a branch chip, and the gates are closed during the input into the branch chip. Thus, the structure is characterized in that energy is supplied to a circuit through which a small amount flows by the resistors R55 and R56. There is no need to explain that the differential drivers 56 and 57 in the side which is controlled are connected by gates, and separation at high impedance is made therebetween.

Although explanation has naturally been made based on a differential transmission line, it is, of course, possible to replace the line with a normal transmission line, for example, to adopt a circuit structure in which one of the electrodes is grounded and rendered common, in view of the base of transmission of electric energy, which means a base such that when pulse energy travels, energy having an opposite phase travels in parallel through a close wire. Needless to say, this circuit structure is included in the scope of the present invention.

Figure 12:
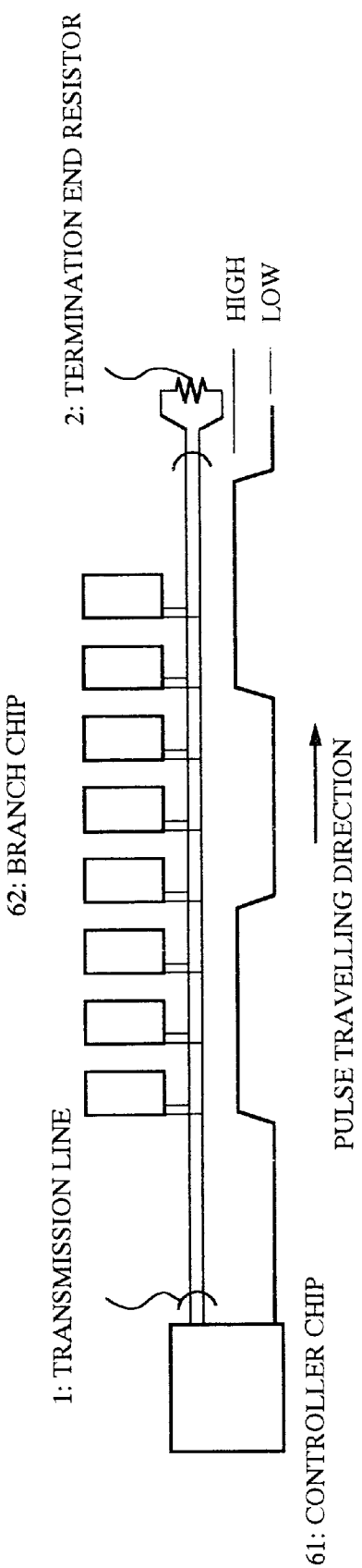
FIG. 12 is a schematic structural view showing an example of the voltage profile in a transmission line observed at an instance, in an electronic device according to an embodiment of the present invention.

Next, a method for matching the timings while several pulse signals are travelling in the transmission line 1 will be explained with reference to FIG. 12. FIG. 12 is a schematic structural view showing an example of a voltage profile in a transmission line observed at an instance.

FIG. 12 shows a state in which a controller chip 61 is connected to the starting end of a transmission line 1, and a plurality of branch chips 62 are branched from and connected to the transmission line 1. If the cycle of signal pulses is short and the transmission line 1 is relatively long, as shown in FIG. 12, several pulses of signals travel in series through the transmission line 1. That is, the branch chips 62 respectively have various timing phases at an instance, and this bus wiring system must be controlled uniformly. To give meaning to these signals, a clock signal and a matched protocol thereto are required for access between the chips. In this respect, if the conditions for preparing the state are such that the line length of the transmission line 1 is set to 400 mm and the clock signal is set to 2, clocks as shown in FIG. 12, 7.5 GHz is calculated where the optical speed of the transmission line 1 is $1.5 \times 10^8$ m/s.

In this structure, the clock signal is transmitted to the transmission line 1, and the branch chips 62 are driven respectively using the times when the clock signal reaches itself on branch lines, as starting points. Therefore, a source synchronous system is basically adopted. Since a matched termination resistor 2 is attached to the termination end of the transmission line 1, the clock signal flows from the controller chip 61, which is transmitting, as a starting point, and the clock signal disappears at the termination end. The chip which generates the clock signal can be controlled most easily if it is the controller chip 61, which is positioned at the starting end of the transmission line 1 which controls the bus wiring system.

Figure 13:
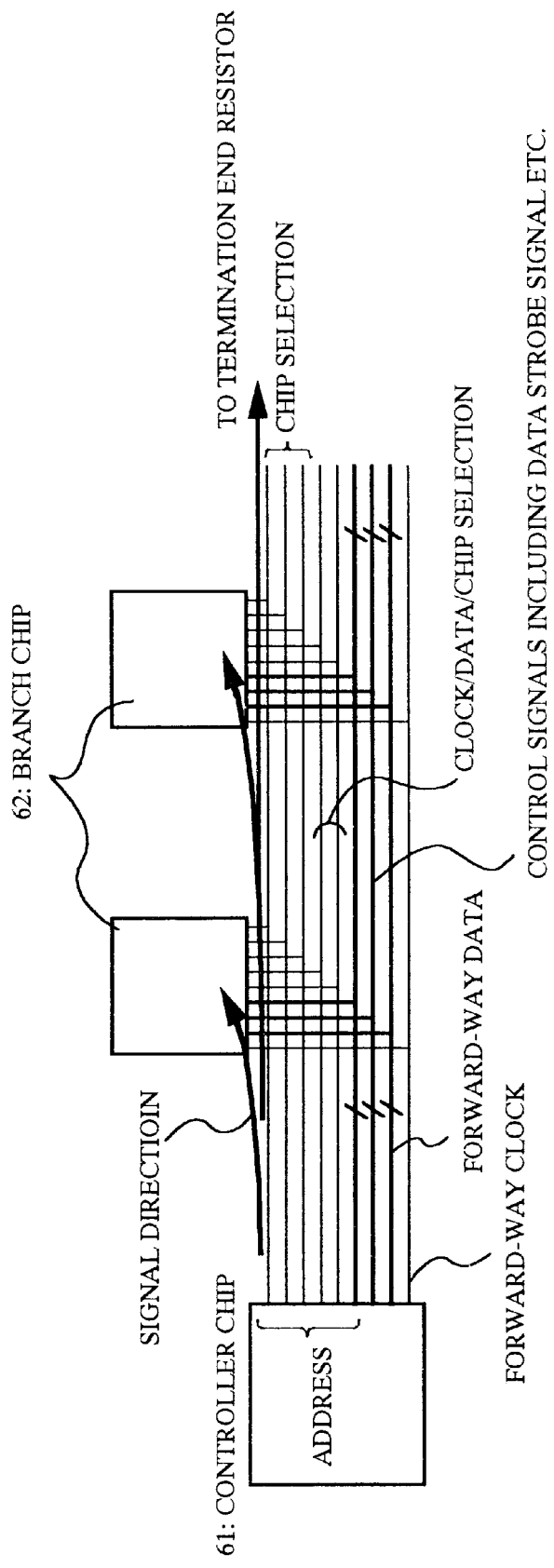
FIG. 13 is a schematic structural view showing signal transmission from a controller chip to a branch chip, and an example of a control system, in an electronic device according to an embodiment of the present invention.
Figure 14:
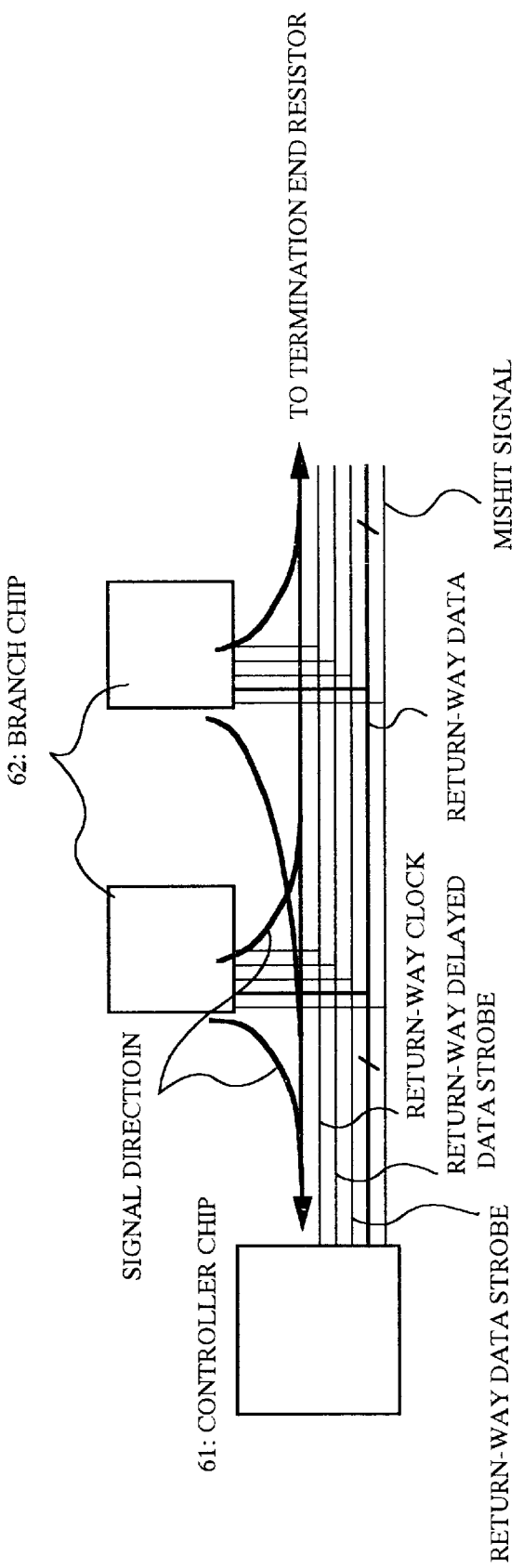
FIG. 14 is a schematic structural view showing signal transmission from a branch chip to a controller chip and an example of a control system, in an electronic device according to an embodiment of the present invention.

Next, a procedure of accessing data during writing data into a branch chip, and reading the data therefrom will be explained with reference to FIGS. 13 and 14. FIG. 13 is a schematic structural view showing signal transmission from the controller chip to the branch chips, and also an example of the control system. FIG. 14 is a schematic structural view showing signal transmission from the branch chips to the controller chip, and also an example of the control system.

Supposing that a part of an address signal is a chip select signal, as shown in FIG. 13, the echo time of each branch chip 62 is measured at the initial setting of the environmental condition of the controller chip 61, using a return-way data strobe line, and the branch chip 62 which has the longest echo time is supplied with a return way active. In FIG. 13, the branch chip 62 is selected and the clock/data select signal is clock-selected. This is fixed while the bus wiring system is operating. It is enabled if there is a margin with respect to the chip select bit number (address). The branch chip 62 which is thus supplied with the return-way active senses a return-way clock signal, generated from the controller chip 61 shown in FIG. 13, and the driver generates the return-way clock signal based on the return-way clock signal. This clock signal flows to the return-way clock line shown in FIG. 14.

This branch chip 62, having the return-way clock active, also generates a data strobe signal by return. The above is a clock generation mechanism.

Subsequently, a procedure of accessing data while writing data into a branch chip 62 will be explained with reference to FIG. 13. During the writing into the branch chip 62, a chip select signal for data and a RAS (Row Address Strobe) of an address are specified at the timing of the return-way clock signal, and subsequently, a CAS (Column Address Strobe) is specified. After CAS latency, the data of the line size is burst-inputted. As the branch chip 62 is more distant from the controller chip 61 on the transmission line 1, the input is delayed. However, if pulse timings of one same return-way clock signal are used, the control signal does not cause a timing skew because of the wires having an equal length, and ,therefore, a conflict is not caused.

Meanwhile, when reading data from the branch chips 62, the procedure from the chip select signal up to the specification of the CAS is achieved by the transmission line 1 in the transmitting side in FIG. 13. Thereafter, a clock signal paired with the data strobe signal which has reached the branch chip 62 at the most distant end returns as a return-way clock signal (also paired with a strobe signal). Upon this timing, the branch chip 62 sends data of the line size to the return-way data line. Since reception of the return-way clock signal by the branch chip 62 changes as an arbitrary setting item of the wire length, data is outputted at the timing of a delay clock signal, which guarantees the reception. The CAS latency is hidden in the waiting times thereof. The read-out data outputted from the branch chip 62 at the timing of the return-way delayed clock signal is synchronously inputted into the controller chip 61.

Needless to say, the bus also includes environmental notification signals, such as a signal which notifies mishit and the like. In the above, the bus structure of a layout-oriented transmission line has been explained, and clock timing charts of this bus wiring system will be now be explained below.

Figure 15:
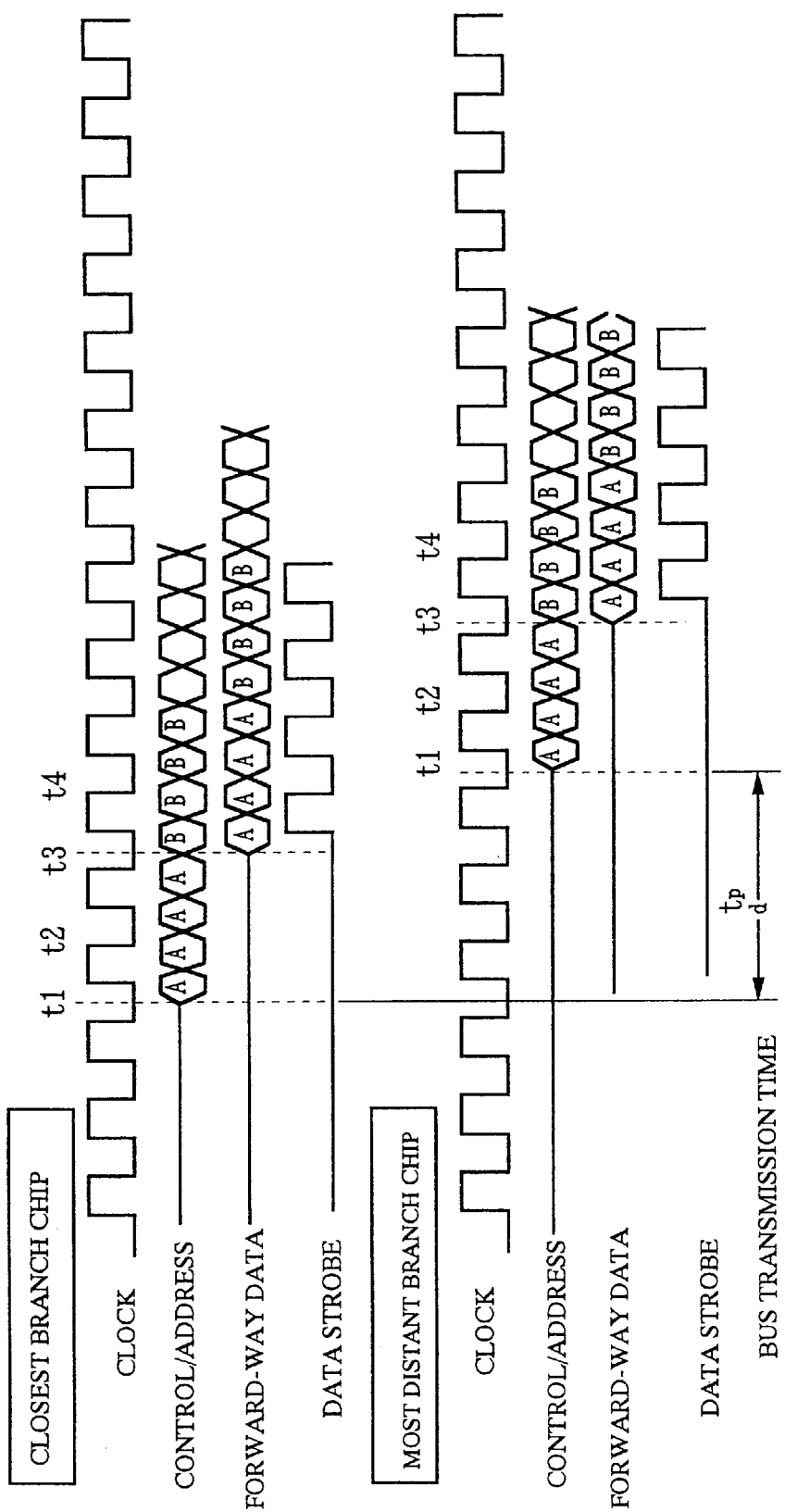
FIG. 15 is a timing chart showing an example of when data is transferred to a branch chip, in an electronic device according to an embodiment of the present invention.
Figure 16:
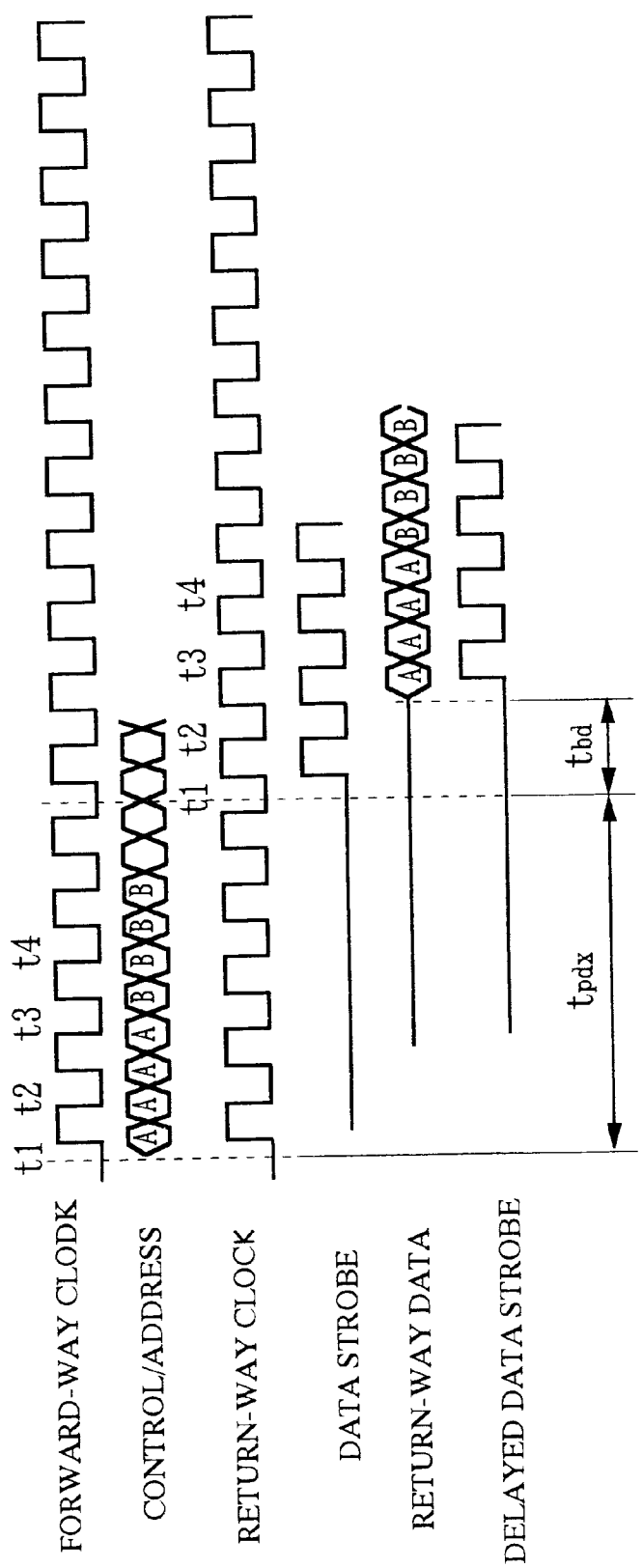
FIG. 16 is a timing chart showing an example of return-way data transfer, in an electronic device according to an embodiment of the present invention.
Figure 17:
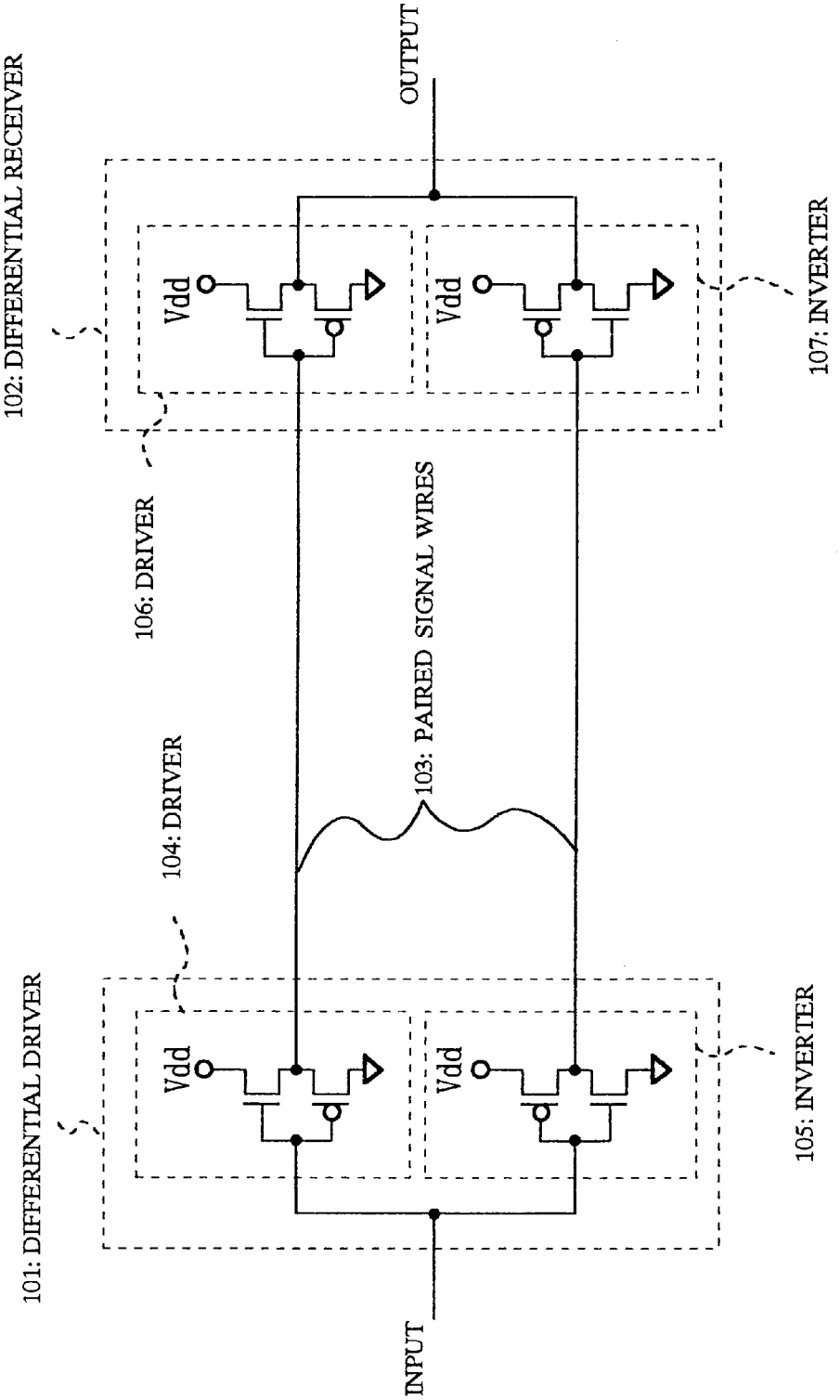
FIG. 17 is a circuit diagram showing the main part of an input/output circuit comprising a driver and a receiver, in an electronic device which is a prerequisite to the present invention.

Next, clock timing charts of the bus wiring system will be explained with reference to FIGS. 15 and 16. FIG. 15 is a timing chart showing an example of when data is transferred to a branch chip, and FIG. 16 is a timing chart showing an example of return-way data transfer.

As shown in FIG. 15, the transfer of forward-way data is very simple. Access to the most distant branch chip 62 is delayed compared to access to the closest branch chip 62 by the delay time ($t_{pd}$) of the bus as a transmission line 1. However, the clock signal and the data strobe signal have an equal delay time, so that the signal source received by the branch chips 62 are shifted in parallel at the same timings. In FIG. 15, the delay is three clocks. However, the physical transmission latency is 0.

Meanwhile, various measures are required for return-way data transfer. In the initial setting, the most distant branch chip 62 is allowed to generate a return-way clock signal and a data strobe signal. As shown in FIG. 16, a control signal of the return-way and an address are inputted into the branch chip 62. However, since there is no data strobe, output is delayed by output latching. As shown in FIG. 16, the waiting time ($t_{pdx}$) is a parameter for each of the branch chips 62. The branch chip 62 which is closest to the controller chip 61 has a waiting time of 2 $t_{pd}$ at most.

In this return-way data transfer, data of the branch chip 62 which has been waiting is outputted upon arrival of a data strobe signal, and is allowed to flow to the bus line after being added, with a delay time ($t_{rd}$) of output latching and with a delay time ($t_{bid}$) of transmission from the branch line 9 to the bus transmission line 1. This is expressed as $t_{bd}$ (=$t_{rd}$+$t_{bid}$) in FIG. 16. Therefore, since there is no way to know the timing of data which the controller chip 61 receives, the branch chip 62 which generates the return-way clock signal receives again the data strobe signal from the bus line, and also generates this by return, only when the control signal is a read command. This is called a delayed data strobe signal, and has the same timing as that of the return-way data transfer. If the branch lines 9 of the branch chips 62 have a substantially equal length within a tolerable range, $t_{bd}$ can be regarded as being constant. The controller chip 61 is brought into a waiting state for data input upon receipt of a strobe signal, and takes in data upon receiving a delayed data strobe signal.

Therefore, $2t_{pd}+2t_{bid}+t_{rd}$ is required until data is received, after a data strobe signal of a control signal is issued with respect to a read command. Where the clock pulse floating in the bus is of 2 clocks ($t_{pd}$=2T, T-clock cycle) and $t_{bid}$ is of 1 clock, physical latency of 6 clocks (6T)+$t_{rd}$ is generated. In a structure in which the data line is of one-way, operations of feeding data to be written and pre-charging can be performed in this period. If the data line is common, this latency cannot be avoided. There appears to be a drawback in which the longer the bus line, the larger the latency. Therefore, a one-way bus line is more advantageous in a long bus wiring system.

This protocol has a feature that latency is expressed as a function of the length of the transmission line 1, not with respect to data writing, but with respect to reading, and the period of this latency can be used for other operation in a one-way data bus. Although this latency cannot be avoided in a two-way data line, this is still useful, since this latency is not so much different from the latency in normal synchronous transmission. In this respect, where the optical speed of the transmission line 1 is $1.5 \times 10^8$ m/s and $t_{pd}$=2T, the lengths of the bus line are respectively 750 mm at 400 MHz, 300 mm at 1 GHz, and 100 mm at 3 GHz, which can be sufficiently useful in practical design.

To summarize the sixth point from the above, the present embodiment also defines how timings are taken when signals of several pulses travel in the transfer line 1, and is characterized in that a return-way clock active is supplied to the branch chip 62 that has the longest echo time with respect to the controller chip 61, and this branch chip 62 generates a data strobe signal by return. Further, the method of knowing the timing at which data is received by the controller chip is characterized in that the branch chip 62 that generates a return-way clock signal receives again the data strobe signal from the transmission line 1, and generates this as a delayed data strobe signal by return, only when the control signal from a branch chip 62 is a read command. As a result of this, it is possible to achieve a transmission speed of 3 GHz, depending on the bus line length of 100 mm, where the optical speed of the transmission line 1 is $1.5 \times 10^8$ m/s and $t_{pd}$=2T.

In the above, the invention made by the present inventor has been specifically explained on the basis of the embodiments thereof. However, the present invention is not limited to the embodiments described above, but can be variously modified without deriving from the scope of the subject matter of the invention.

For example, in the embodiments described above, an explanation has been made of a differential transmission line for transmitting a differential complementary digital signal. However, the present invention is applicable if this transmission line is replaced with a normal transmission line, based on a circuit structure in which one electrode is grounded and rendered common. Further, a driver circuit based on a CMOS circuit structure has been explained. However, it is needless to say that a bipolar circuit is better, in consideration of the difficulty to reduce variations of the threshold voltage of the CMOS circuit and the problem of electrostatic breakdown of very thin oxide films of gates.

A representative example of the aspects of the present invention disclosed in the present application will be summarized in brief as follows.

According to an electronic device of the present invention, in an input/output circuit which, combines a driver with a bus wiring system comprising a transmission line and a termination end circuit matched with the transmission line, attenuation of signal energy during transmission can be restricted, and electromagnetic interference between adjacent transmission lines can be restricted by specifying the driver as a current switch type, as well as the transmission lines as parallel wires having an equal length which have characteristic impedance of 25Ω or less. Therefore, it is possible to realize signal transmission at a higher speed in a bus wiring system.

Particularly, it is possible to improve signal transmission at a higher speed in one direction and in two directions between a controller chip, which is connected to a starting end of a differential transmission line and has a differential driver and a differential receiver, and a memory/input/output interface chip, which is branched from and connected to the differential transmission line which has a differential receiver and a differential driver. It is therefore possible to provide an electronic device capable of realizing a high-speed transmission line of a bus wiring system.

What is claimed is:

1. An electronic device comprising:
a transmission line having opposed paired wires including a first wire and a second wire;
a termination circuit matched with said transmission line;
a driver circuit for supplying a bus wiring system with complementary signals, said bus wiring system comprising said transmission line and said termination circuit;
a wiring board including said transmission line and said termination circuit; and
a first integrated circuit chip including said driver circuit and mounted on said wiring board;
wherein said driver circuit comprises an input node, first to fourth nodes, a first transistor which has a current path between the first node and the third node and has a control electrode connected to the input node, a second transistor which has a current path between the third node and the second node and has a control electrode connected to the input node, a third transistor which has a current path between the first node and the fourth node and has a control electrode connected to the input node, a fourth transistor which has a current path between the fourth node and the second node and has a control electrode connected to the input node, the first and the fourth transistors being a first conductivity type, the second and third transistors being a second conductivity type, the first wire being connected to the third node and the second wire being connected to the fourth node;
wherein the first wire and the second wire have characteristic impedance of 25Ω or less, have equal length and are arranged in parallel to each, and
wherein said termination circuit comprises a pure resistor of 25Ω or less being connected in series with each of said first and second wires.

2. The electronic device according to claim 1, wherein said driver circuit is of a current switch type.

3. The electronic device according to claim 2, wherein a pure resistor is connected in series with said driver circuit thereby to form a ON-resistance which is of equal to or higher than characteristic impedance of said transmission line or is of preferably three times or more higher than characteristic impedance of said transmission line.

4. The electronic device according to claim 1, wherein a second integrated circuit chip is connected to have a receiver circuit branched from and connected on a bus of said transmission line, and said receiver circuit has high impedance of 1 KΩ or more.

5. The electronic device according to claim 4, wherein when said receiver circuit is connected with a branch line having a transmission line structure of 4 mm or less, a pure resistor of 0.4 to 1 KΩ is connected in series with each of both of opposed paired wires, at a branch portion of said branch line.

6. The electronic device according to claim 5, wherein an insulating layer between said transmission line and said branch line has thickness which is as several times large as thickness of an insulating layer between said opposed paired wires of each of said transmission line and said branch line.

7. The electronic device according to claim 1, wherein a power-source/ground line is structured in a transmission line structure, said power-source/ground line being fanned out from said first integrated circuit including said driver circuit.

8. The electronic device according to claim 7, wherein said transmission line of said power-source/ground line comprising paired power-source wire and ground wire has characteristic impedance equal to or lower than characteristic impedance of a signal line.

9. The electronic device according to claim 1, wherein a second integrated circuit chip having a driver circuit of a current switch type is branched from and connected on a bus of said transmission line; said first integrated circuit chip has a receiver circuit of high impedance; and a complementary signal sent from said driver circuit of said second integrated circuit chip is received by said receiver circuit of said first integrated circuit chip.

10. The electronic device according to claim 9, wherein a signal flowing from said driver circuit of said second integrated circuit chip to said transmission line flows with an amplitude which is one half of an original amplitude on said transmission line, said signal flowing in directions toward said receiver circuit and said termination end circuit, and signal energy is totally reflected at said receiver circuit thereby recovering said original amplitude, so that said receiver circuit operates normally, while signal energy flowing toward said termination end circuit is absorbed and erased.

11. The electronic device according to claim 10, wherein when said driver circuit is connected with a branch line having a transmission line structure, a chip of a bus transceiver gate for opening only a gate of an active branch wire is inserted at a branch portion of said branch line; and said branch line has characteristic impedance which is lower than or is preferably ½ of that of said transmission line.

12. The electronic device according to claim 11, wherein said chip of said bus transceiver gate is structured in a collected chip structure in which a plurality of buses of said transmission line are respectively connected through gates of their own and is arranged obliquely so as to follow above said power-source/ground line.

13. The electronic device according to claim 1, wherein a second integrated circuit chip having a receiver circuit and a driver circuit of a current switch type, is branched from and connected on a bus of said transmission line; said first integrated circuit chip has said driver circuit and a receiver circuit having high impedance; and a complementary signal is bidirectionally transferred between said driver and receiver circuits of said first integrated circuit chip and said receiver and driver circuits of said second integrated circuit chip, respectively.

14. The electronic device according to claim 13, wherein a circuit in which a resistor and a gate having high impedance during outputting and become a matched end during inputting are connected in series to an exit of a combination circuit of said driver and receiver circuits of said first integrated circuit chip, is inserted between input and output ends of said transmission line.

15. The electronic device according to claim 14, wherein when said receiver circuit and driver circuit of said second integrated circuit chip is connected with a branch line of a transmission line structure, a chip in which a bus transceiver gate and a high resistor are connected in parallel is inserted to a branch portion of said branch line; and said bus transceiver gate is opened when said first integrated circuit chip is outputting and said bus transceiver gate is closed when said first integrate circuit chip is inputting, so that energy is supplied to said high resistor.

16. The electronic device according to claim 13, wherein said transmission line is a differential transmission line which transmits a differential complementary signal; said driver circuits of said first integrated circuit is a differential driver circuit; and said receiver circuit is a differential receiver circuit.

17. The electronic device according to claim 13, wherein said first integrated circuit chip is a controller chip connected to a starting end of said transmission line; and said second integrated circuit chip is a memory/input/output interface chip.

18. The electronic device according to claim 1, wherein when a plurality of second to n-th integrated circuit chips are branched from and connected on said transmission line; said driver circuit of said first integrated circuit chip has a control function; and a timing is taken, when signals of several pulses travel through said transmission line, in a manner in which said first integrated circuit chip measures echo times of said second to n-th integrated circuit chips, a return-way clock active is supplied to an integrated circuit chip which has a longest echo time, said integrated circuit chip which is supplied with said return-way clock active detects a forward-way clock signal, said first integrated circuit chip generates a return-way clock signal based on said detected return-way clock signal, and said integrated circuit chip which is supplied with said return-way clock active generates a data strobe signal by return.

19. An electronic device according to claim 18, wherein a timing of data to be received by said first integrated circuit chip is known in a manner in which only when a control signal from said first integrated circuit chip is a read command, an integrated circuit chip which generates a return-way clock signal receives again a data strobe signal from said transmission line and issues said data strobe signal as a delayed data strobe signal by return.

20. An electronic device comprising:
a transmission line;
a termination end circuit matched with said transmission line;
a driver circuit for supplying a bus wiring system with a complementary signal, said driver circuit comprising said transmission line and said termination end circuit;

a wiring board including said transmission line and said termination end circuit; and a first integrated circuit chip including said driver circuit and mounted on said wiring board;

said transmission line being of a bus structure in which a line having characteristic impedance of 25Ω or less and having a structure comprising opposed paired wires is wired such that said opposed paired wires are parallel to each and have an equal length;

wherein a second integrated circuit chip is mounted is connected to have a receiver circuit branched from and connected on a bus of said transmission line, and said receiver circuit has high impedance of 1 KΩ or more;

wherein when said receiver circuit is connected with a branch line having a transmission line structure of 4 mm or less, a pure resistor of 0.4 to 1 KΩ is connected in series with each of both of opposed paired wires, at a branch portion of said branch line.

21. The electronic device according to claim 20, wherein an insulating layer between said transmission line and said branch line has thickness which is as several times large as thickness of an insulating layer between said opposed paired wires of each of said transmission line and said branch line.

22. An electronic device comprising:

a transmission line;

a termination end circuit matched with said transmission line;

a driver circuit for supplying a bus wiring system with a complementary signal, said driver circuit comprising said transmission line and said termination end circuit;

a wiring board including said transmission line and said termination end circuit; and a first integrated circuit chip including said driver circuit and mounted on said wiring board;

said transmission line being of a bus structure in which a line having characteristic impedance of 25Ω or less and having a structure comprising opposed paired wires is wired such that said opposed paired wires are parallel to each and have an equal length;

wherein a second integrated circuit chip having a driver circuit of a current switch type is branched from and connected on a bus of said transmission line; said first integrated circuit chip has a receiver circuit of high impedance; and a complementary signal sent from said driver circuit of said second integrated circuit chip is received by said receiver circuit of said first integrated circuit chip;

wherein a signal flowing from said driver circuit of said second integrated circuit chip to said transmission line flows with an amplitude which is one half of an original amplitude on said transmission line, said signal flowing in directions toward said receiver circuit and said termination end circuit, and signal energy is totally reflected at said receiver circuit thereby recovering said original amplitude, so that said receiver circuit operates normally, while signal energy flowing toward said termination end circuit is absorbed and erased;

wherein when said driver circuit is connected with a branch line having a transmission line structure, a chip of a bus transceiver gate for opening only a gate of an active branch wire is inserted at a branch portion of said branch line; and said branch line has characteristic impedance which is lower than or is preferably ½ of that of said transmission line, wherein said chip of said bus transceiver gate is structured in a collected chip structure in which a plurality of buses of said transmission line are respectively connected through gates of their own and is arranged obliquely so as to follow above said power-source/ground line.

23. An electronic device comprising:

a transmission line;

a termination end circuit matched with said transmission line;

a driver circuit for supplying a bus wiring system with a complementary signal, said driver circuit comprising said transmission line and said termination end circuit;

a wiring board including said transmission line and said termination end circuit; and a first integrated circuit chip including said driver circuit and mounted on said wiring board;

said transmission line being of a bus structure in which a line having characteristic impedance of 25Ω or less and having a structure comprising opposed paired wires is wired such that said opposed paired wires are parallel to each and have an equal length;

wherein a circuit in which a resistor and a gate having high impedance during outputting and become a matched end during inputting are connected in series to an exit of a combination circuit of said driver and receiver circuits of said first integrated circuit chip, is inserted between input and output ends of said transmission line;

wherein a second integrated circuit chip having a receiver circuit and a driver circuit of a current switch type, is branched from and connected on a bus of said transmission line; said first integrated circuit chip has said driver circuit and a receiver circuit having high impedance; and a complementary signal is bidirectionally transferred between said driver and receiver circuits of said first integrated circuit chip and said receiver and driver circuits of said second integrated circuit chip, respectively;

wherein a circuit in which a resistor and a gate having high impedance during outputting and become a matched end during inputting are connected in series to an exit of a combination circuit of said driver and receiver circuits of said first integrated circuit chip, is inserted between input and output ends of said transmission line.

24. The electronic device according to claim 23, wherein when said receiver circuit and driver circuit of said second integrated circuit chip is connected with a branch line of a transmission line structure, a chip in which a bus transceiver gate and a high resistor are connected in parallel is inserted to a branch portion of said branch line; and said bus transceiver gate is opened when said first integrated circuit chip is outputting and said bus transceiver gate is closed when said first integrate circuit chip is inputting, so that energy is supplied to said high resistor.

25. An electronic device comprising:

a transmission line;

a termination end circuit matched with said transmission line;

a driver circuit for supplying a bus wiring system with a complementary signal, said driver circuit comprising said transmission line and said termination end circuit;

a wiring board including said transmission line and said termination end circuit; and a first integrated circuit chip including said driver circuit and mounted on said wiring board;

said transmission line being of a bus structure in which a line having characteristic impedance of 25Ω or less and having a structure comprising opposed paired wires is wired such that said opposed paired wires are parallel to each and have an equal length;

wherein when a plurality of second to n-th integrated circuit chips are branched from and connected on said transmission line; said driver circuit of said first integrated circuit chip has a control function; and a timing is taken, when signals of several pulses travel through said transmission line, in a manner in which said first integrated circuit chip measures echo times of said second to n-th integrated circuit chips, a return-way clock active is supplied to an integrated circuit chip which has a longest echo time, said integrated circuit chip which is supplied with said return-way clock active detects a forward-way clock signal, said first integrated circuit chip generates a return-way clock signal based on said detected return-way clock signal, and said integrated circuit chip which is supplied with said return-way clock active generates a data strobe signal by return.

26. The electronic device according to claim 25, wherein a timing of data to be received by said first integrated circuit chip is known in a manner in which only when a control signal from said first integrated circuit chip is a read command, an integrated circuit chip which generates a return-way clock signal receives again a data strobe signal from said transmission line and issues said data strobe signal as a delayed data strobe signal by return.

* * * * *